(12) United States Patent  
Sasagawa et al.

(10) Patent No.: US 7,791,154 B2
(45) Date of Patent: Sep. 7, 2010

(54) PHOTOELECTRIC CONVERSION ELEMENT AND MANUFACTURING METHOD OF PHOTOELECTRIC CONVERSION ELEMENT

(75) Inventors: Shinya Sasagawa, Kanagawa (JP); Shinya Hasegawa, Kanagawa (JP); Hidekazu Takahashi, Tochigi (JP); Tatsuya Arao, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/575,910

(22) Filed: Oct. 8, 2009

(65) Prior Publication Data

US 2010/0019337 A1    Jan. 28, 2010

Related U.S. Application Data

(63) Continuation of application No. 11/737,477, filed on Apr. 19, 2007, now Pat. No. 7,622,785.

(30) Foreign Application Priority Data

Apr. 28, 2006    (JP)    ............................... 2006-125830

(51) Int. Cl.
    *H10L 31/075*    (2006.01)
    *H01L 31/18*    (2006.01)
(52) U.S. Cl. ............... 257/432; 257/458; 257/E31.032; 257/E31.127; 438/151
(58) Field of Classification Search .................. 257/432, 257/458, 435, E31.032, E31.127; 438/57, 438/70, 80, 98, 149, 151
See application file for complete search history.

(56) References Cited

U.S. PATENT DOCUMENTS 4,315,279 A    2/1982    Kuwayama
4,762,807 A    8/1988    Yamazaki (Continued)

FOREIGN PATENT DOCUMENTS

JP    58-097862    6/1983

(Continued)

OTHER PUBLICATIONS

Michael Quirk, "Semiconductor Manufacturing Technology", 2001, Prentice-Hall, p. 456-459.

(Continued)

*Primary Examiner*—Thomas L Dickey
*Assistant Examiner*—Nikolay Yushin
(74) *Attorney, Agent, or Firm*—Fish & Richardson P.C.

(57) ABSTRACT

An object is to provide a photoelectric conversion element having a side surface with different taper angles by conducting etching of a photoelectric conversion layer step-by-step. A pin photodiode has a high response speed compared with a pn photodiode but has a disadvantage of large dark current. One cause of the dark current is considered to be conduction through an etching residue which is generated in etching and deposited on a side surface of the photoelectric conversion layer. Leakage current of the photoelectric conversion element is reduced by forming a structure in which a side surface has two different tapered shapes, which conventionally has a uniform surface, so that the photoelectric conversion layer has a side surface of a p-layer and a side surface of an n-layer, which are not in the same plane.

48 Claims, 22 Drawing Sheets

U.S. PATENT DOCUMENTS

| | | |
|---|---|---|
| 4,862,237 A | 8/1989 | Morozumi |
| 5,043,784 A | 8/1991 | Yamamoto |
| 6,177,710 B1 | 1/2001 | Nishikata |
| 2002/0185588 A1 | 12/2002 | Wagner |
| 2004/0121500 A1 | 6/2004 | Ketelsen |
| 2004/0248414 A1 | 12/2004 | Tsai |
| 2005/0030518 A1 | 2/2005 | Nishi |
| 2005/0056842 A1 | 3/2005 | Nishi |
| 2005/0082463 A1 | 4/2005 | Koyama |
| 2005/0098731 A1 | 5/2005 | Granfors |
| 2005/0116310 A1 | 6/2005 | Nishi |
| 2005/0167573 A1 | 8/2005 | Maruyama |
| 2005/0181610 A1 | 8/2005 | Sasagawa |
| 2006/0186497 A1 | 8/2006 | Nishi |
| 2006/0255280 A1 | 11/2006 | Shibayama |
| 2006/0261253 A1 | 11/2006 | Arao |
| 2007/0113886 A1 | 5/2007 | Arao |

FOREIGN PATENT DOCUMENTS

| | | |
|---|---|---|
| JP | 60-241260 | 11/1985 |
| JP | 63-269570 | 11/1988 |
| JP | 01-145143 | 10/1989 |
| JP | 02-001184 | 1/1990 |
| JP | 03-268369 | 11/1991 |
| JP | 05-167056 | 7/1993 |
| JP | 10-112551 | 4/1998 |
| JP | 2005-129909 | 5/2005 |
| JP | 2005-136392 | 5/2005 |
| WO | WO 97/48137 | 12/1997 |

OTHER PUBLICATIONS

Invitation to Pay Additional Fees (Application No. PCT/JP2007/058887) dated May 22, 2007.

International Search Report (PCT Application No. PCT/JP2007/058887) mailed Jul. 24, 2007, 4 pages.

Written Opinion (PCT Application No. PCT/JP2007/058887) mailed Jul. 24, 2007, 4 pages.

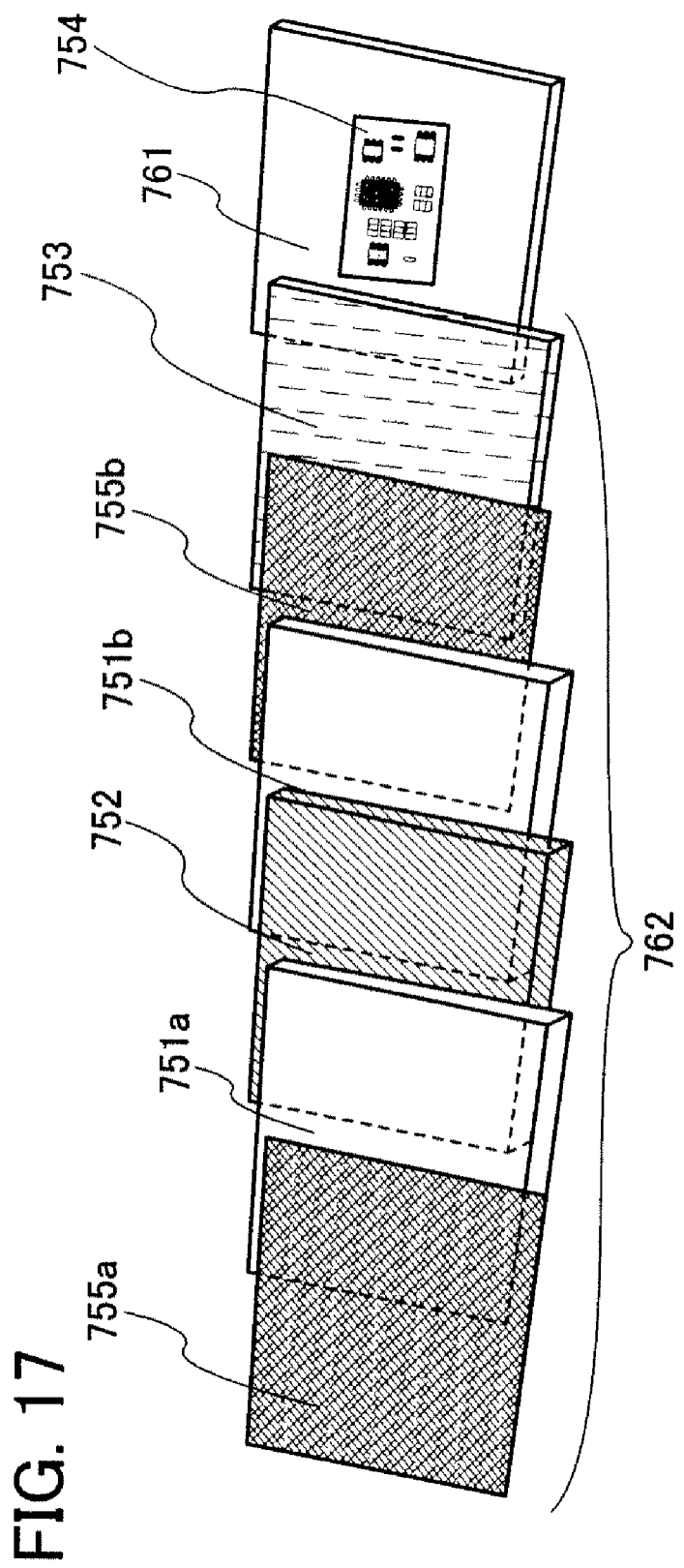

PHOTOELECTRIC CONVERSION ELEMENT AND MANUFACTURING METHOD OF PHOTOELECTRIC CONVERSION ELEMENT

CROSS-REFERENCE TO RELATED APPLICATIONS

This application is a continuation of U.S. application Ser. No. 11/737,477, filed Apr. 19, 2007, now allowed, which claims the benefit of a foreign priority application filed in Japan as Serial No. 2006-125830 on Apr. 28, 2006, both of which are incorporated by reference.

TECHNICAL FIELD

The present invention relates to a photoelectric conversion device which converts received light into an electric signal to output. In particular, the present invention relates to a photoelectric conversion device including a thin film semiconductor element and a manufacturing method thereof. Further, the present invention relates to a semiconductor device and an electronic appliance including a photoelectric conversion element.

Note that in this specification, a photoelectric conversion element refers to a stacked-layer body of thin films including one individual photoelectric conversion layer, and a photoelectric conversion device refers to an assembly of one or a plurality of photoelectric conversion elements and a semiconductor device including a combination of a photoelectric conversion element and another element.

BACKGROUND ART

A photoelectric conversion device is used for detection of an electromagnetic wave and a photoelectric conversion device having sensitivity in ultraviolet rays to infrared light rays is also referred to as a light sensor in general. Among light sensors, one having sensitivity in a visible light region of a wavelength of 400 to 700 nm is referred to as a visible light sensor, which is variously used for an appliance that needs illuminance adjustment or on-off control depending on the environment (see Patent Document 1: Japanese Published Patent Application No. 2005-129909).

In a display device, ambient brightness is detected to adjust display luminance of the display device. This is because it is possible to reduce power consumption and to improve visibility by detecting the ambient brightness and obtaining appropriate display luminance. For example, such a light sensor for adjusting luminance is used in a display portion of a mobile phone and in a display portion of a personal computer. In the mobile phone, power consumption of key button illumination may be reduced as well as power consumption of a display portion.

In addition, luminance of a display portion can be adjusted by detecting luminance of a display device by a light sensor, as well as the ambient brightness. In specific, luminance of a display screen is adjusted with use of a light sensor detecting luminance of a backlight of a liquid crystal display device.

Further, in a display device provided with a projector, convergence adjustment is carried out with use of a light sensor. The convergence adjustment is to adjust an image so that an image of each color of RGB does not generate discrepancy. With use of a light sensor, a location of an image of each color is detected, and the image is located in the right location.

A photoelectric conversion element (a photodiode) is roughly classified into four types: a pn type, a pin type, a Schottky type, and an avalanche type. A pn photodiode is a photoelectric conversion element which uses a junction of a p-type semiconductor and an n-type semiconductor. A pin photodiode is a photoelectric conversion element having a structure in which an intrinsic semiconductor (i-type semiconductor) is interposed between a p-type semiconductor and an n-type semiconductor in a pn photodiode. A pn photodiode has small dark current and a low response speed. A pin photodiode has a high response speed and large dark current.

A p-type semiconductor is a semiconductor in which holes are mainly used as a carrier for transferring charge because of loss of electrons. An n-type semiconductor is a semiconductor in which electrons are mainly used as a carrier for transferring charge because of excessive electrons. An intrinsic semiconductor is a semiconductor formed of a high purity semiconductor material. A Schottky photodiode is a photoelectric conversion element which uses a junction of a gold thin film layer, instead of a p-type semiconductor layer, and an n-type layer. An avalanche photodiode is a photoelectric conversion element with high speed and high sensitivity, in which photoelectric current is doubled by reverse bias voltage applied thereto. Note that a p-type semiconductor layer is referred to as a p-layer, an i-type semiconductor layer is referred to as an i-layer, and an n-type semiconductor layer is referred to as an n-layer.

DISCLOSURE OF INVENTION

An example of a conventional pin photodiode is shown in FIG. 4B. In FIG. 4B, a base layer 115 is provided over a substrate 100, a first conductive layer 112 is provided over the base layer 115, a semiconductor layer 103D including a first semiconductor layer 103A, a second semiconductor layer 103B, and a third semiconductor layer 103C is provided over the first conductive layer 112, the first conductive layer 112 and the first semiconductor layer 103A are connected each other, an insulating layer 107 having an opening is provided over the third semiconductor layer 103C, a second conductive layer 117 is provided over the insulating layer 107, the second conductive layer 117 is connected to the third semiconductor layer 103C through the opening in the insulating layer 107, an insulating layer 109 having an opening is provided to cover the foregoing stacked-layer structure, a third conductive layer 111 is provided over the insulating layer 109, and the third conductive layer 111 is connected to the first conductive layer 112 and the second conductive layer 117 through the opening in the insulating layer 109. Side surfaces of end portions of the first semiconductor layer 103A, the second semiconductor layer 103B, and the third semiconductor layer 103C are in the same plane. An impurity element of one conductivity type is added to the first semiconductor layer 103A, and an impurity element of an opposite conductivity type to that in the first semiconductor layer 103A is added to the third semiconductor layer 103C. The second semiconductor layer 103B is an intrinsic semiconductor.

In the photoelectric conversion element shown in FIG. 4B, leakage current is likely to be generated. It is the same in FIG. 4A. As one cause of generation of the leakage current, an etching residue is taken into consideration, which is deposited on the side surface in the end portion of the semiconductor layer (semiconductor layers including a p layer, an i-layer, and an n-layer which are continuously arranged) serving as a photoelectric conversion layer. The etching residue is generated in an etching step. The etching residue generated in an etching step is deposited on an etched surface (regions surrounded by dotted lines 114A to 114D in FIGS. 4A and 4B) which is the end portion of the semiconductor layer 103D. It is considered that leakage current is generated due to conduction through the etching residue.

It is an object of the present invention to manufacture a highly reliable photoelectric conversion device with a high yield by reducing leakage current generated on an etched surface in a pin photoelectric conversion element.

In a photoelectric conversion element of the present invention, only the side surface in the end portion of the third semiconductor layer 103C, or the side surface in the end portion of the third semiconductor layer 103C and a part of the side surface of the second semiconductor layer 103B are removed by etching. Therefore a side surface in the end portion of the semiconductor layer 103D has two surfaces with different taper angles.

As shown in FIG. 1, a photoelectric conversion element of the present invention has a photoelectric conversion layer including stacked layers a first semiconductor layer, a second semiconductor layer and a third semiconductor layer, the first semiconductor layer containing an impurity element of one conductivity type, on a conductive layer, the second semiconductor layer formed on the first semiconductor layer, and the third semiconductor layer containing an impurity element of an opposite conductivity type to that in the first semiconductor layer, on the second semiconductor layer, in which a side surface of the photoelectric conversion layer includes a surface with a first taper angle and a surface with a second taper angle, in which the surface with the first taper angle includes a side surface of the first semiconductor layer and a part of a side surface of the second semiconductor layer, in which the surface with the second taper angle includes another part of the side surface of the second semiconductor layer and a side surface of the third semiconductor layer, and in which the surface with the first taper angle and the surface with the second taper angle have different taper angles. It is preferable that the taper angle of the surface with the first taper angle is larger than the taper angle of the surface with the second taper angle.

In addition, the surface with the second taper angle may only include the side surface in the end portion of the third semiconductor layer.

The first to third semiconductor layers preferably contain silicon as main components. In a photoelectric conversion element of the present invention, it is preferable that the first semiconductor layer is a p-type semiconductor layer, the third semiconductor layer is an n-type semiconductor layer, and a photoelectric conversion element is formed over a light-transmitting substrate such as a glass substrate.

In a photoelectric conversion element of the present invention, the conductive layer provided under the photoelectric conversion layer preferably has a tapered shape. It is more preferable that a protective layer is provided to cover an end portion of the conductive layer and the semiconductor layer is provided over the protective layer. The protective layer may include a color filter layer. In that case, an overcoat layer is preferably provided between the color filter layer and the photoelectric conversion layer.

It is preferable that a photoelectric conversion element of the present invention is formed over the base layer, and the base layer base layer comprises a material selected from a group consisting of polyimide, acrylic resin, an epoxy resin and a combination thereof. It is more preferable that a region in the base layer which is not overlapped by the photoelectric conversion element has unevenness, and a layer formed of a same material of the base layer is provided over the region with unevenness.

The conductive layer provided under the photoelectric conversion layer included in a photoelectric conversion element of the present invention is preferably formed of a light-transmitting conductive material or titanium.

A semiconductor device of the present invention includes a photoelectric conversion element with the foregoing characteristics and a thin film transistor. It is preferable that the semiconductor device of the present invention includes a current amplifier circuit which amplifies an output being connected to the photoelectric conversion element, and the current amplifier circuit is a current mirror circuit including a plurality of transistors.

In a semiconductor device of the present invention, a light blocking layer is preferably provided in a region overlapping with an end portion of the photoelectric conversion element and in a region on a substrate side, overlapping with a channel formation region in a semiconductor layer included in the thin film transistor.

A method for manufacturing a photoelectric conversion element of the present invention includes; forming a conductive layer over a substrate, forming a protective layer on the conductive layer, forming a first semiconductor layer containing an impurity element of one conductivity type, on the conductive layer, forming a second semiconductor layer on the first semiconductor layer, forming a third semiconductor layer containing an impurity element of an opposite conductivity type to that in the first semiconductor layer, on the second semiconductor layer, selectively forming a resist having a tapered shape over the first to third semiconductor layers, conducting a first dry etching to remove a part of the third semiconductor layer and a part of the second semiconductor layer with use of the resist, conducting a second dry etching to remove a part of the third semiconductor layer and a part of the second semiconductor layer with use of a gas containing $O_2$ and having an etching rate of the second semiconductor layer lower than a gas used in the first dry etching, in which an oxide layer is formed on the third semiconductor layer due to the second dry etching, and conducting a third dry etching to remove the oxide layer with use of a gas having an etching rate of the oxide layer higher than that of the second semiconductor layer. The protective layer does not always need to be formed if not required. The first to third semiconductor layers preferably contain silicon as main components. It is more preferable that a mixed gas of $CF_4$ and $Cl_2$ is used in the first dry etching, a mixed gas of $CF_4$ and $O_2$ is used in the second dry etching, and a mixed gas of $CHF_3$ and $He$ is used in the third dry etching.

In this specification, a taper angle refers to, in a layer having a tapered shape, an inclination angle (interior angle) between a side surface and a bottom surface of the layer. When a side surface is rounded, the taper angel refers to an angle between a bottom surface and a tangent line at an intersection of the side surface and the bottom surface. In addition, hard baking of a resist is a heat treatment which is carried out at a certain temperature. By hard baking, a size of a resist is reduced and a taper angle thereof can be reduced.

In this specification, an etching rate refers to an amount to be etched per unit time.

In this specification, over etching refers to etching conducted, in etching of a layer to be etched with a predetermined thickness, for an additional predetermined time added to an average time for completing the etching. The additional predetermined time is determined with consideration of distribution over a substrate surface. With over etching, the layer to be etched is prevented from remaining.

In this specification, a connection is synonymous to an electrical connection. Therefore, in a structure disclosed in the present invention, another element which enables electrical connection (such as a switch, a transistor, a capacitor, an inductor, a resistor, or a diode) may be included in a predetermined connection relationship.

In this specification, in a case where an i-type semiconductor layer (intrinsic semiconductor layer) is a silicon film, the i-type semiconductor layer (intrinsic semiconductor layer) refers to a semiconductor layer which contains an impurity imparting p-type or n-type conductivity at a concentration of $1\times10^{20}$ cm$^{-3}$ or less and contains oxygen and nitrogen at a concentration of $5\times10^{19}$ cm$^{-3}$ or less. Note that photoconductivity is preferably 1000 times or more with respect to dark conductivity. In addition, 10 to 1000 ppm of boron (B) may be added to the i-type semiconductor layer.

With the present invention, leakage current of a photoelectric conversion device can be reduced.

Further, in the present invention, when etching is conducted to form unevenness in the base layer, adhesion of a resin film or the like is improved.

Therefore, with the present invention, a highly reliable pin photoelectric conversion element can be manufactured with a high yield. Further, a highly reliable electronic appliance including the pin photoelectric conversion element can be manufactured with a high yield.

BRIEF DESCRIPTION OF DRAWINGS

FIG. 17 shows an electronic appliance including a photoelectric conversion device of the present invention;

BEST MODE FOR CARRYING OUT THE INVENTION

Hereinafter, embodiment modes and embodiments of the present invention are described with reference to the drawings. However, the present invention can be carried out with many different modes and it is easily understood by those skilled in the art that modes and details can be modified in various ways without departing from the purpose and the scope of the present invention. Accordingly, the present invention should not be interpreted as being limited to the description of the embodiment modes and the embodiments.

Embodiment Mode 1

Figure 1:
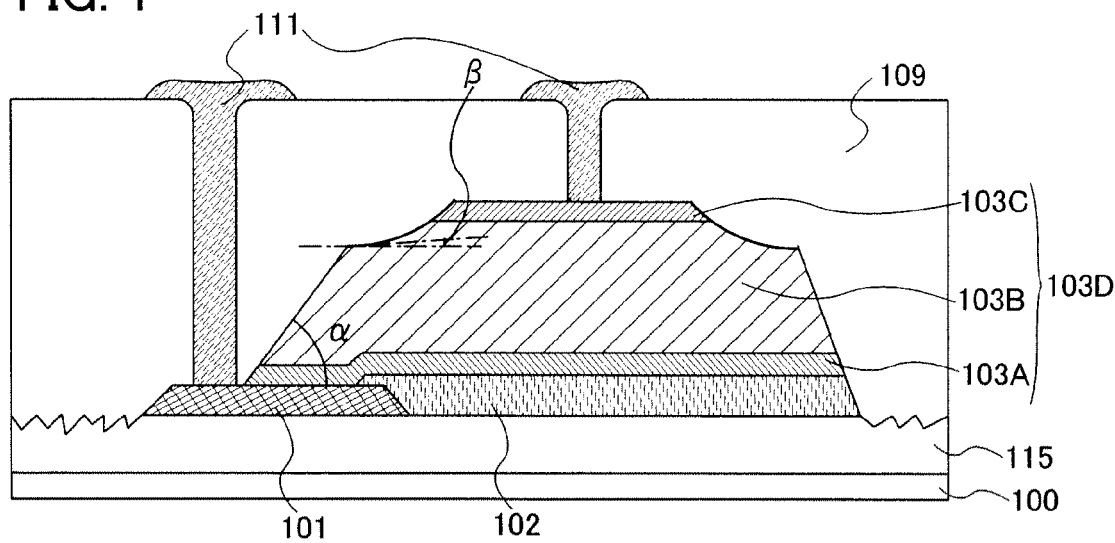
FIG. 1 is a cross-sectional view of a photoelectric conversion element of the present invention.

In this embodiment mode, a photoelectric conversion element to which the present invention is applied and a manufacturing process of the photoelectric conversion element are described with reference to FIGS. 1 to 2C and 5A to 7B. FIGS. 1, to 2C show cross-sectional views of a photoelectric conversion element of the present invention. FIGS. 5A to 7B show cross-sectional views for describing a manufacturing process of a photoelectric conversion element of the present invention.

FIG. 1 shows a photoelectric conversion element of the present invention. In the photoelectric conversion element shown in FIG. 1, the base layer 115 is provided over the substrate 100, a first conductive layer 101 and a protective layer 102 covering an end portion of the first conductive layer 101 are provided over the base layer 115, the semiconductor layer 103D is provided over the first conductive layer 101 and the protective layer 102, the insulating layer 109 having an opening is provided over the semiconductor layer 103D, and the third conductive layer 111 is provided over the insulating layer 109. The semiconductor layer 103D includes a stacked layer of the first semiconductor layer 103A, the second semiconductor layer 103B, and the third semiconductor layer 103C, in which the first semiconductor layer 103A is electrically connected to the first conductive layer 101, and the third semiconductor layer 103C is electrically connected to the third conductive layer 111. The first semiconductor layer 103A contains an impurity element of one conductivity type and the third semiconductor layer 103C contains an impurity element of an opposite conductivity type to that in the first semiconductor layer 103A. A side surface in the end portion of the semiconductor layer 103D has a surface with a first taper angle where a surface is continued with a fixed taper angle (angle α in FIG. 1) from the first semiconductor layer 103A to the second semiconductor layer 103B, and a surface with a second taper angle where a surface is continued with a fixed taper angle (angle β in FIG. 1) from the second semiconductor layer 103B to the third semiconductor layer 103C. The surface with the first taper angle and the surface with the second taper angle have different taper angles. The taper angle of the surface with the first taper angle is larger than the taper angle of surface with the second taper angle.

A manufacturing method of a photoelectric conversion element of the present invention is described with reference to FIG. 5A to 7B. In this embodiment mode, the photoelectric conversion element is formed over the substrate 100.

As the substrate 100, a glass substrate or the like with an insulating property is used. The substrate 100 may be a flexible substrate. As a flexible substrate, a plastic or the like can be used. In a case in which the substrate 100 is a glass substrate, an area and a shape thereof are not particularly limited. Therefore, for example, a rectangular glass substrate with one meter or more on a side can be used as the substrate 100, and productivity can be improved compared to a case of using a circular single crystalline silicon substrate. Further, if the substrate 100 is a plastic substrate, since the plastic substrate is thin, light, and bendable, a semiconductor device which allows various designs can be manufactured, and the semiconductor device can be easily formed into various shapes. With use of a plastic substrate, a highly impact-resistant photoelectric conversion device can be manufactured. In addition, it becomes easy to attach or embed a photoelectric conversion device into various goods, which allows application to wide variety of fields. Further, if the substrate 100 is a plastic substrate, it is necessary to use a plastic with heat resistance which withstands a processing temperature in a manufacturing process. Therefore, it is preferable that a thin film transistor (hereinafter, referred to as a TFT) is provided over a glass substrate, and then, the TFT is separated to be transferred over a plastic substrate. As a flexible substrate, a film of polyethylene naphthalate (PEN) can be specifically used. Other than polyethylene naphthalate, a film of polyethylene terephthalate (PET), polybutylene naphthalate (PBN), polyimide (PI), polyamide (PA), or the like may be used.

The base layer 115 is formed over the substrate 100 used in this embodiment mode. The base layer 115 is formed of an organic resin such as polyamide, acrylic, or an epoxy resin. The base layer 115 is preferably formed to be thicker than any one of layers included in a stacked-layer film formed in subsequent steps. The base layer 115 is preferably formed by a spin coating method or a droplet discharging method with use of a liquid such as a resin paste.

Figure 5A:
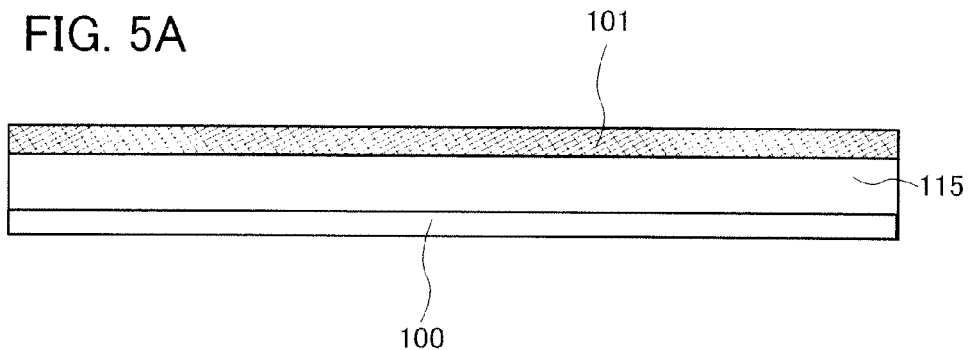
FIGS. 5A to 5C are cross-sectional views showing a manufacturing process of a photoelectric conversion element of the present invention.

Then, the first conductive layer 101 is formed overt the base layer 115 (FIG. 5A). The first conductive layer 101 may be a single layer or a stacked layer. In a case of forming the first conductive layer 101 by a single layer, a film formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or an alloy material or a compound material containing any of the elements as its main component, or a film formed of a nitride thereof (such as titanium nitride, tungsten nitride, tantalum nitride, or molybdenum nitride) can be used. In a case of forming the first conductive layer 101 by a stacked layer, the elements may be combined to be used. The first conductive layer 101 is formed with use of a CVD method, a sputtering method, a droplet discharging method, or the like. In this embodiment mode, a single layer of Ti is formed.

Next, the first conductive layer 101 having a desired pattern is formed by etching or the like of the first conductive layer 101. A chlorine-based gas may be used for etching of the first conductive layer 101. In this embodiment mode, dry etching is conducted with use of a mixed gas of $BCl_3$ and $Cl_2$. The etching is conducted with a gas flow rate of 60:20 (sccm), a pressure in a chamber of 1.9 Pa, and a temperature of 70° C., and an RF (13.56 MHz) electric power of 450 W is applied to a coiled electrode to generate plasma and an RF (13.56 MHz) electric power of 100 W is applied to the substrate side, so that negative bias power is substantially applied and self-bias voltage is generated. Here, a tapered shape is formed to have a taper angle of approximately 30°. Note that the taper angle can be reduced by hard baking a resist. An etching method is not particularly limited and a capacitively coupled plasma (CCP) method, an electron cyclotron resonance (ECR) method, or a reactive ion etching (RIE) method, or the like can be used, as well as an inductively coupled plasma (ICP) method.

Note that the foregoing etching condition is one example and the etching condition is not limited thereto. As long as the first conductive layer 101 can be etched, a kind of a gas, a gas flow rate, a pressure or a temperature in a chamber, electric power to be applied, or the like is not particularly limited.

Figure 5B:
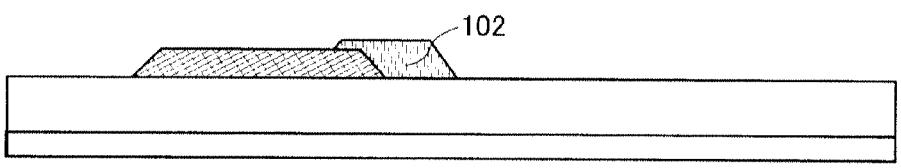

Subsequently, the protective layer 102 is formed (FIG. 5B). The protective layer 102 covers an end portion of the pattern formed first conductive layer 101 and is favorably covered with the semiconductor layer 103D serving as the photoelectric conversion layer at the end portion of the first conductive layer 101 serving as an electrode, in order to prevent an electric field from concentrating on the end portion of the electrode (first conductive layer 101). The protective layer 102 may be formed of an insulating material or a conductive material. When conductivity of the protective layer 102 is high, tolerance to static electricity is lowered; therefore, the protective layer 102 preferably has high resistance. Further, when an organic resin such as polyimide is used, the protective layer 102 can be easily formed only by coating, exposing light, developing, and baking, with use of a photosensitive material, and the taper angle becomes small, so that coverage of a film formed at a subsequent step can be improved. Note that in a case where light is taken from the substrate 100 side, the protective layer 102 is desirably formed of a material with high light transmittance. In this embodiment mode, polyimide is used as the protective layer 102.

Figure 5C:
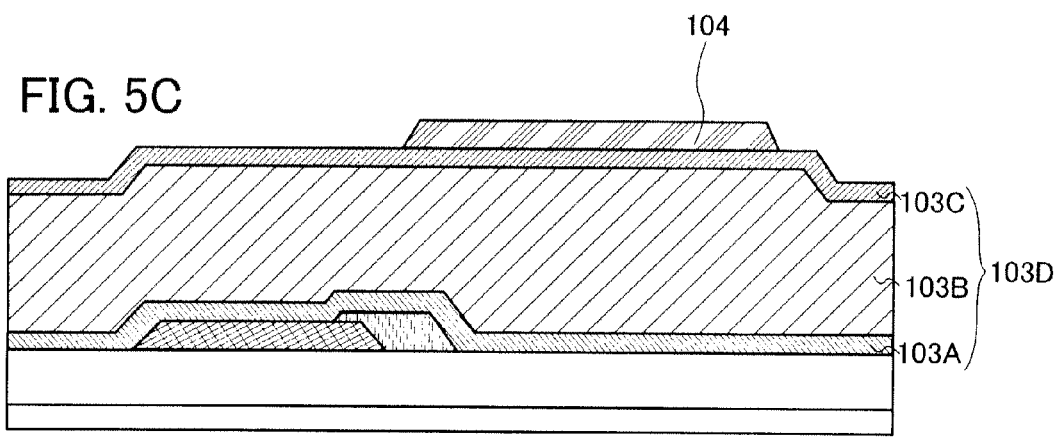

Then, the semiconductor layer 103D is formed by sequentially stacking the first semiconductor layer 103A, the second semiconductor layer 103B, and the third semiconductor layer 103C over the first conductive layer 101 (FIG. 5C).

The first semiconductor layer 103A is a p-type semiconductor layer and is formed by an amorphous silicon film containing an impurity element imparting p-type conductivity. The first semiconductor layer 103A is formed with use of a semiconductor material gas containing an impurity element belonging to Group 13 (such as boron (B)) by a plasma CVD method. As the semiconductor material gas, silane ($SiH_4$) may be used. Alternatively, $Si_2H_6$, $SiH_2Cl_2$, $SiHCl_3$, $SiC_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a chemical vapor deposition method, a sputtering method, or the like may be used. The first semiconductor layer 103A is preferably formed to have a thickness of 10 to 50 nm.

The second semiconductor layer 103B is an i-type semiconductor layer (intrinsic semiconductor layer) and is formed by an amorphous silicon film. As for formation of the second semiconductor layer 103B, an amorphous silicon film is formed with use of a semiconductor material gas by a plasma CVD method. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 103B may be alternatively formed by an LPCVD method, a chemical vapor deposition method, a sputtering method, or the like. The second semiconductor layer 103B is preferably formed to have a thickness of 200 to 1000 nm.

The third semiconductor layer 103C is an n-type semiconductor layer and is formed by an amorphous silicon film containing an impurity element imparting n-type conductivity. The third semiconductor layer 103C is formed with use of a semiconductor material gas containing an impurity element belonging to Group 15 (such as phosphorus (P)) by a plasma CVD method. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a chemical vapor deposition method, a sputtering method, or the like may be used. The third semiconductor layer 103C is preferably formed to have a thickness of 20 to 200 nm.

Note that the p-type semiconductor layer, the i-type semiconductor layer, and the n-type semiconductor layer may be stacked in the reversed order. In other words, the first semiconductor layer 103A may be formed of an n-type semiconductor, the second semiconductor layer 103B may be formed of an i-type semiconductor, and the third semiconductor layer 103C may be formed of a p-type semiconductor. In this case, it is preferable that light is taken from the opposite direction of the substrate, that is, a side on which the thin films are stacked. In general, in a pin photodiode, a structure in which light is taken from a p-type semiconductor layer side is preferable.

Further, the first semiconductor layer 103A, the second semiconductor layer 103B, and the third semiconductor layer 103C are not necessarily formed with use of an amorphous semiconductor, and they may be formed with use of a polycrystalline semiconductor or a semiamorphous semiconductor (hereinafter, referred to as an SAS).

Note that an SAS refers to a semiconductor with an intermediate structure between an amorphous structure and a crystalline structure (including a single crystal and polycrystal). The SAS is a semiconductor having a third condition that is stable in terms of free energy and is a crystal having a short range order and lattice distortion which can be diffused in a non-single crystalline semiconductor film with its particle diameter of 0.5 to 20 nm. The SAS has Raman spectrum shifted to a lower wavenumber side than 520 $cm^{-1}$, and diffraction peaks of (111) and (220) that are thought to be caused by a crystal lattice of Si are observed by X-ray diffraction. In addition, the SAS contains at least 1 atomic % of hydrogen or halogen to terminate a dangling bond. In this specification, such a semiconductor is referred to as a SAS for the sake of convenience. Moreover, a noble gas element such as helium, argon, krypton, or neon may be contained to further promote lattice distortion, so that stability is enhanced and a semiamorphous semiconductor with favorable characteristics can be obtained. Note that a microcrystalline semiconductor is also included in the SAS. The SAS can be obtained by glow discharge decomposition of a gas containing silicon. A typical gas containing silicon is silane ($SiH_4$), and $Si_2H_6$, $SiH_2Cl_2$, $SiHCl_3$, $SiCl_4$, $SiF_4$, and the like may also be used. When the gas containing silicon is diluted with hydrogen or with a gas in which at least one of noble gas elements selected from helium, argon, krypton, or neon is added to hydrogen, the SAS can be formed easily. It is preferable that the gas containing silicon is diluted at a dilution ratio in a range of 2 to 1000 times. Further, the energy bandwidth can be adjusted to be 1.5 to 2.4 eV or 0.9 to 1.1 eV when a carbide gas such as $CH_4$ or $C_2H_6$, a germanium gas such as $GeH_4$ or $GeF_4$, $F_2$, or the like is mixed into the gas containing silicon.

Then, a resist 104 is formed to have a desired pattern over the third semiconductor layer 103C (FIG. 5C). As a resist used in today's mass production line, one having a novolac resin as its main component can be given. A resist having a novolac resin as its main component is preferable because of its high resistance to dry etching. In addition, a resist having a polyethylene-based resin as its main component may be used since the resist having a polyethylene-based resin as its main component also has high resistance to dry etching.

Subsequently, a desired portion of the semiconductor layer 103D is removed by dry etching with use of the resist 104 as a mask. The formation of the pattern is conducted by three etchings which are referred to as first to third etchings.

Figure 6A:
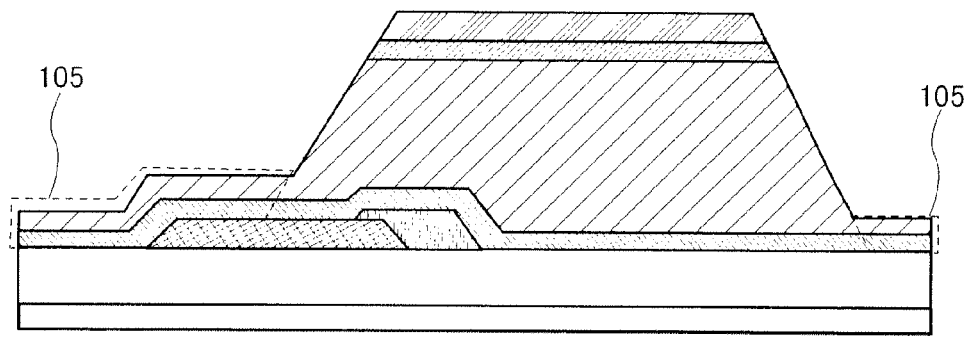
FIGS. 6A to 6C are cross-sectional views showing a manufacturing process of a photoelectric conversion element of the present invention.

A mixed gas of $CF_4$ and $Cl_2$ of which etching rate of amorphous silicon is high is preferably used in the first etching. Here, for example, the etching is conducted with a gas flow rate of 40:40 (sccm), a pressure in a chamber of 2.0 Pa, and a temperature of 70° C., and an RF (13.56 MHz) electric power of 450 W is applied to a coiled electrode to generate plasma and an RF (13.56 MHz) electric power of 100 W is applied to the substrate side, so that negative bias power is substantially applied and self-bias voltage is generated. With such a condition, the semiconductor layer 103D which is formed to be thick can be etched in a short period of time. In addition, since the semiconductor layer 103D is thick as described above, it is possible to conduct etching to leave a part of the second semiconductor layer 103B and the first semiconductor layer by adjusting an etching time (FIG. 6A). Alternatively, the etching may be conducted to leave only a part of the first semiconductor layer 103A.

Note that the foregoing etching condition is one example and the etching condition is not limited thereto. As long as the semiconductor layer 103D can be etched, a kind of a gas, a gas flow rate, a pressure or a temperature in a chamber, electric power to be applied, or the like is not particularly limited.

Then, the second etching is conducted to etch and remove a region 105 surrounded by a dotted line in the semiconductor layer 103D, which is left after the first etching step. The second etching is preferably conducted with use of a gas containing $O_2$ and more preferably, a mixed gas of $CF_4$ and $O_2$. In a case where Ti is used for the first conductive layer 101, for example, the etching is conducted with a gas flow rate of 45:55 (sccm), a pressure in a chamber of 2.5 Pa, and a temperature of 70° C., and an RF (13.56 MHz) electric power of 500 W is applied to a coiled electrode to generate plasma and an RF (13.56 MHz) electric power of 200 W is applied to the substrate side, so that negative bias power is substantially applied and self-bias voltage is generated. Thus, only the region 105 surrounded by the dotted line in the semiconductor layer 103D can be removed by etching without removing the first conductive layer 101.

Figure 6B:
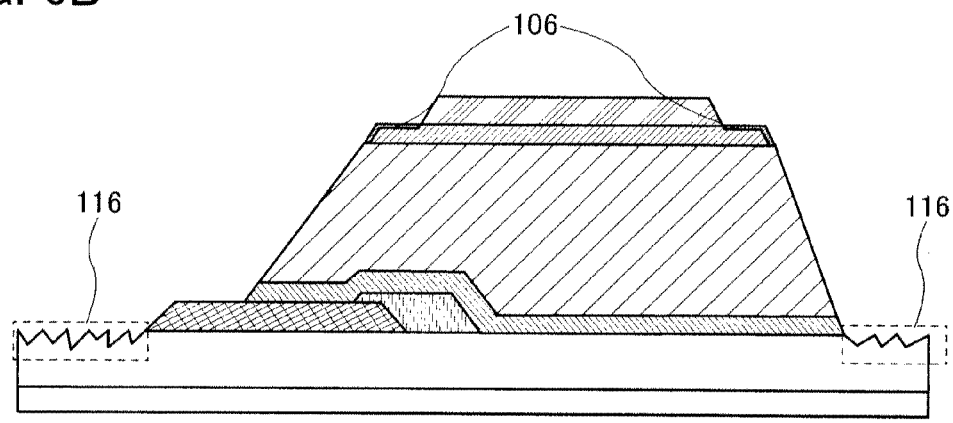

In dry etching with use of a mixed gas containing $O_2$, the resist retreats by being etched isotropically and a region to be covered is reduced. Also, since a region exposed from the mask on a surface of the third semiconductor layer 103C is oxidized, a silicon oxide layer 106 is formed (FIG. 6B). At this time, the first conductive layer 101 thereunder is not etched.

In the second etching, over etching is preferably conducted. It is preferable that etching is conducted until unevenness is formed on a surface of the base layer 115 as shown in a region 116 surrounded by a dotted line. When the base layer 115 has an uneven surface, adhesion of an insulating film formed over the base layer 115 in a subsequent step is improved.

Next, the third etching is conducted to remove the silicon oxide layer 106 selectively. As the third etching, dry etching with use of a mixed gas of $CHF_3$ and He is preferably conducted. For example, the etching is conducted with a gas flow rate of 7.5:142.5 (sccm), a pressure in a chamber of 5.5 Pa, and a temperature of 70° C., and an RF (13.56 MHz) electric power of 475 W is applied to a coiled electrode to generate plasma and an RF (13.56 MHz) electric power of 300 W is applied to the substrate side, so that negative bias power is substantially applied and self-bias voltage is generated. By conducting etching under such a condition, it is possible to improve an etching rate of silicon oxide while suppressing an etching rate of silicon; accordingly, the silicon oxide layer 106 can be removed while leaving the second semiconductor layer 103B. Note that a region to be removed by etching here is not necessarily limited to the silicon oxide layer 106, and the second semiconductor layer 103B may be partly removed.

Note that the foregoing etching condition is one example and the etching condition is not limited thereto. As long as the region of the third semiconductor layer 103C exposed from the resist 104 and a part of the second semiconductor layer 103B can be etched, or only the region of the third semiconductor layer 103C exposed from the resist 104 can be etched, a kind of a gas, a gas flow rate, a pressure or a temperature in a chamber, electric power to be applied, or the like is not particularly limited.

As described above, when the region of the third semiconductor layer 103C exposed from the resist 104 and a part of the second semiconductor layer 103B are removed, or only the region of the third semiconductor layer 103C exposed from the resist 104 is removed, the semiconductor layer 103D can be formed to have one side surface including two surfaces with different taper angles. Note that one of the two surfaces with different taper angles of the side surface in the end portion does not include an n-layer 103C.

Then, after light ashing with $O_2$ plasma, the resist is peeled to be removed by a predetermined chemical solution.

Figure 6C:
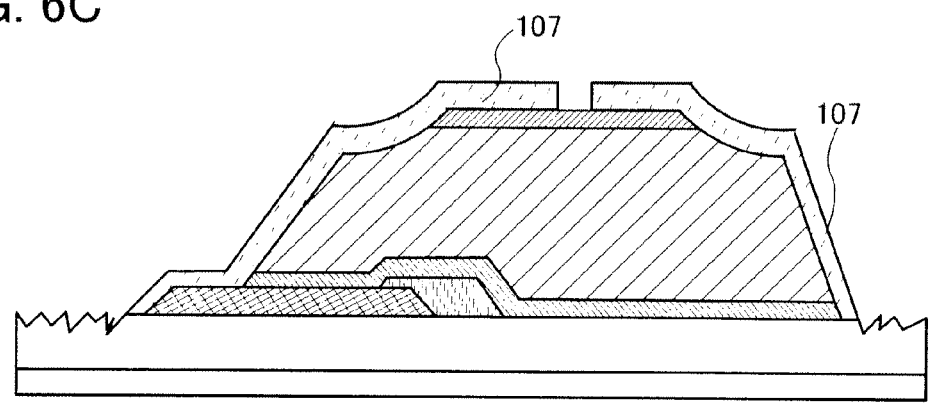

Subsequently, the insulating layer 107 is formed. The insulating layer 107 may be formed of an insulating material, and a material and a forming method thereof are not particularly limited. For example, the insulating layer 107 may be formed by a CVD method, or the like. As a material used for the formation of the insulating layer 107, a silicon oxide-based material, a silicon nitride-based material, a siloxane resin, or the like can be given. A silicon oxide-based material refers to silicon oxide containing oxygen and silicon as its main components and silicon oxynitride which is silicon oxide contains nitrogen, and in which more oxygen is contained than nitrogen. A silicon nitride-based material refers to silicon nitride containing nitrogen and silicon as its main components and silicon nitride oxide which is silicon nitride containing oxygen, and in which more nitrogen is contained than oxygen. A siloxane resin is a resin having a Si—O—Si bond. Siloxane has a skeleton structure including a bond of silicon (Si) and oxygen (O). It is preferable that the insulating layer 107 is formed of a photosensitive resin such as photosensitive polyimide. Note that in a case of taking light from the opposite direction of the substrate 100, an insulating film with high light transmittance is preferably used. In this embodiment mode, the insulating layer 107 is formed with use of photosensitive polyimide and is patterned by light exposure. The insulating layer 107 may be formed over the entire surface, but the insulating layer 107 is preferably formed except for the region in which unevenness of the base layer 115 is formed (FIG. 6C). The insulating layer 107 is formed to have an opening in a portion in which a second conductive layer 108 which is formed later and the third semiconductor layer 103C are connected.

Then, the second conductive layer 108 is formed. The second conductive layer 108 may be a single layer or a stacked layer. As a material for the second conductive layer 108, a similar material to the first conductive layer 101 may be used. That is, in a case of forming the second conductive layer 108 by a single layer, a film formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), copper (Cu), or nickel (Ni), or an alloy material or a compound material containing any of the elements as its main component, or a film formed of a nitride thereof (such as titanium nitride, tungsten nitride, tantalum nitride, or molybdenum nitride) can be used. In a case of forming the second conductive layer 108 by a stacked layer, the elements may be combined to be used. The second conductive layer 108 may be formed with use of a CVD method, a sputtering method, a droplet discharging method, or the like. Here, a single layer of Ti is formed. After forming the second conductive layer 108, etching or the like is conducted as required similarly to the first conductive layer 101, so that a conductive layer with a desired pattern is formed.

Next, the insulating layer 109 is formed. A material of the insulating layer 109 is not particularly limited, and a silicon nitride-based material, a silicon oxide-based material, BSG (Boron Silicate Glass), PSG (Phosphorus Silicate Glass), BPSG (Boron Phosphorus Silicate Glass), a resin material, or the like can be used. Preferably, an organic resin material (polyamide or acrylic) or a siloxane resin is used. For the formation of the insulating layer 109, a droplet discharging method (also referred to as an ink jet method depending on its type, and discharging includes ejection; the same applies hereinafter), a screen printing method, a spin coating method, or the like can be used. Alternatively, a CVD method or the like may be used. Here, an epoxy resin is formed by a screen printing method. Since unevenness is formed on the surface of the base layer 115, the insulating layer 109 adheres to the base layer 115 and covers the base layer 115 favorably. In particular, the insulating layer 109 and the base layer 115 are preferably formed of a same kind of material because the adhesion is improved.

Figure 7A:
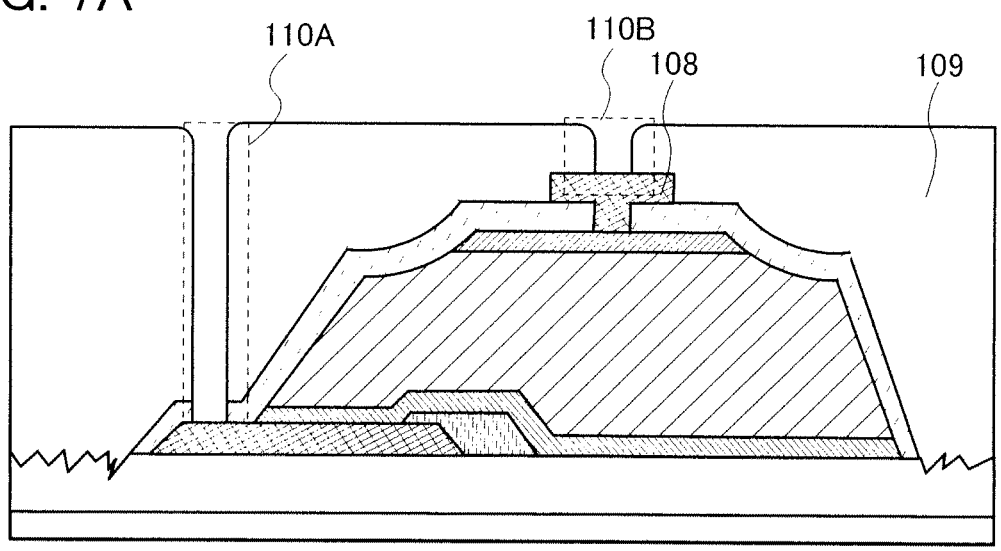
FIGS. 7A and 7B are cross-sectional views showing a manufacturing process of a photoelectric conversion element of the present invention.

Then, an opening 110A and an opening 110B are formed in the insulating layer 109 (FIG. 7A). If the insulating layer 109 is already formed to have a desired pattern by using a screen printing method or a droplet discharging method for forming the insulating layer 109, this step is not always required. In a case of forming the insulating layer 109 over the entire surface and then forming a pattern by removing a predetermined portion, the pattern can be formed only by coating, exposing light, developing, and baking, with use of a photosensitive material. In addition, since the second taper angle becomes small, coverage of a layer formed in a subsequent step can be favorable. An opening 110A is formed to reach the first conductive layer 101 and an opening 110B is formed to reach the second conductive layer 108.

Figure 7B:
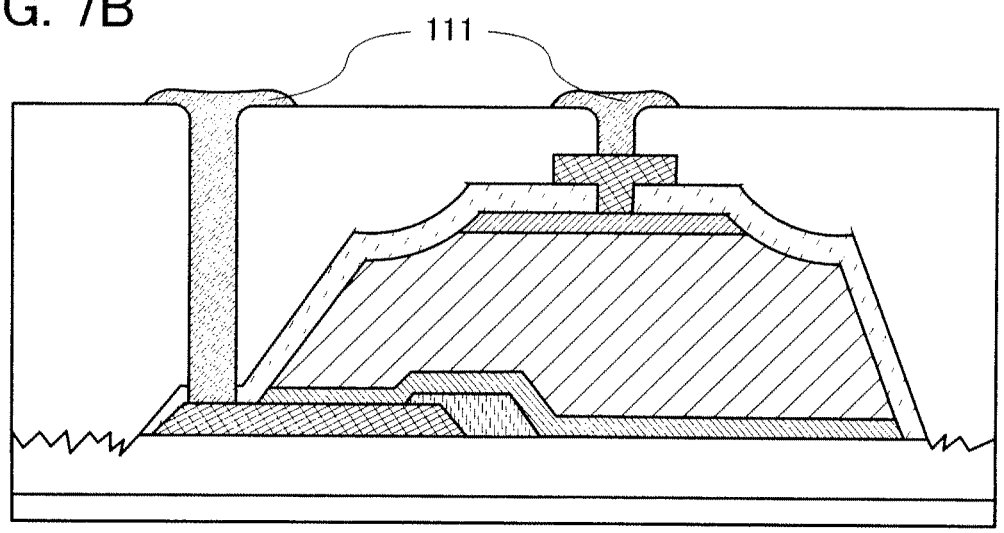

Then, the third conductive layer 111 is formed in the opening 110A and the opening 110B (FIG. 7B). The third conductive layer 111 can be formed of a conductive paste with use of a screen printing method, a droplet discharging method, or the like. In this embodiment mode, a screen printing method is used. As a conductive paste, a conductive paste containing a metal material such as silver (Ag), gold (Au), copper (Cu), or nickel (Ni), or a conductive carbon paste can be used. The third conductive layer 111 is formed to be connected to the first conductive layer 101 and the second conductive layer 108.

Figure 2A:
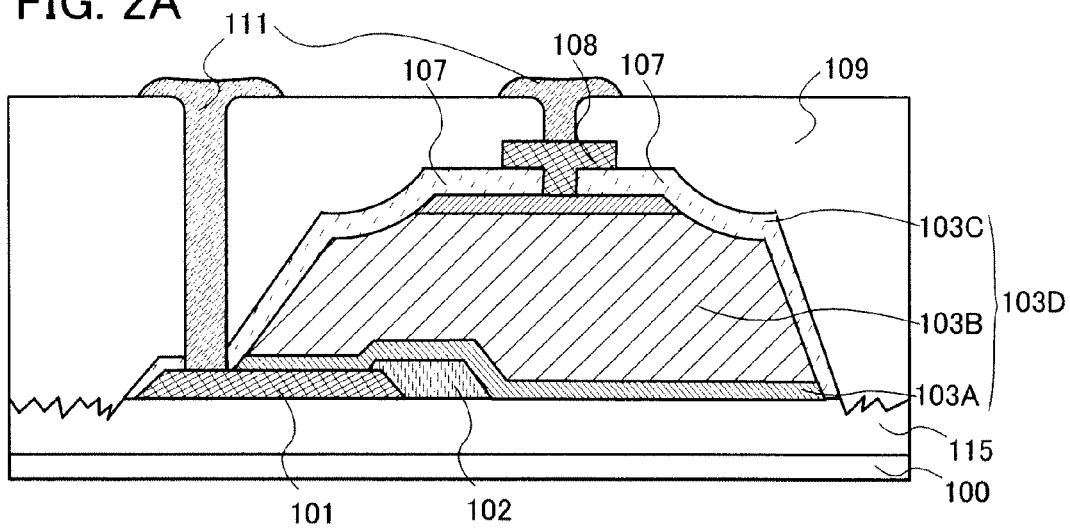
FIGS. 2A to 2C are cross-sectional views of a photoelectric conversion element of the present invention.
Figure 2B:
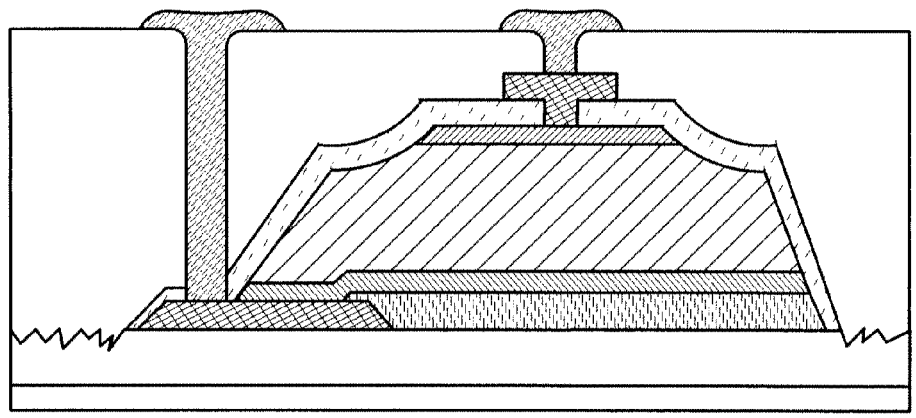
Figure 2C:
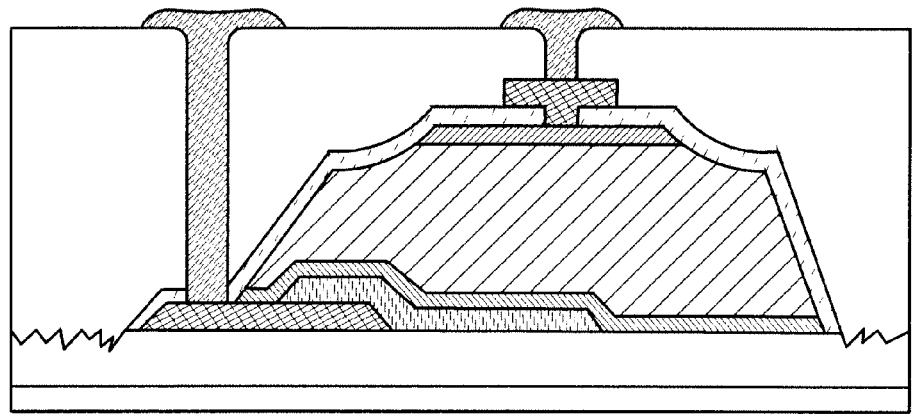

As described above, a photoelectric conversion element manufactured by the present invention is shown in FIGS. 2A to 2C. In FIG. 2A, the protective layer 102 is formed only over the end portion of the first conductive layer 101. In FIG. 2B, the protective layer 102 is formed to be in a region where the first semiconductor layer 103A is in contact with the substrate in FIG. 2A and to cover the end portion of the first conductive layer 101, thus a structure in which the substrate 100 and the semiconductor layer 103A are not in contact with each other is formed. In FIG. 2C, the protective layer 102 is formed to have a uniform thickness. The protective layer 102 shown in FIG. 2C is formed of an inorganic insulating material or the like with use of a CVD method or the like. Two taper-shape portions with different taper angles can be formed by removing the region of the third semiconductor layer 103C exposed from the resist 104 and a part of the side surface in an end portion of the second semiconductor layer 103B, or by removing only the region of the third semiconductor layer 103C exposed from the resist 104. Thus, a distance from the first semiconductor layer 103A to the third semiconductor layer 103C on the side surface in the end portion can be larger; therefore, a possibility of conduction through an etching residue can be reduced.

With the present invention, a photoelectric conversion element with a resin film or the like formed between layers having high adhesion and with small leakage current can be obtained. Therefore, a highly reliable pin photoelectric conversion element can be manufactured. Further, a highly reliable electronic appliance including the pin photoelectric conversion element can be manufactured.

Note that this embodiment mode can be freely combined with another embodiment mode and Embodiments 1 to 3.

Embodiment Mode 2

Figure 3A:
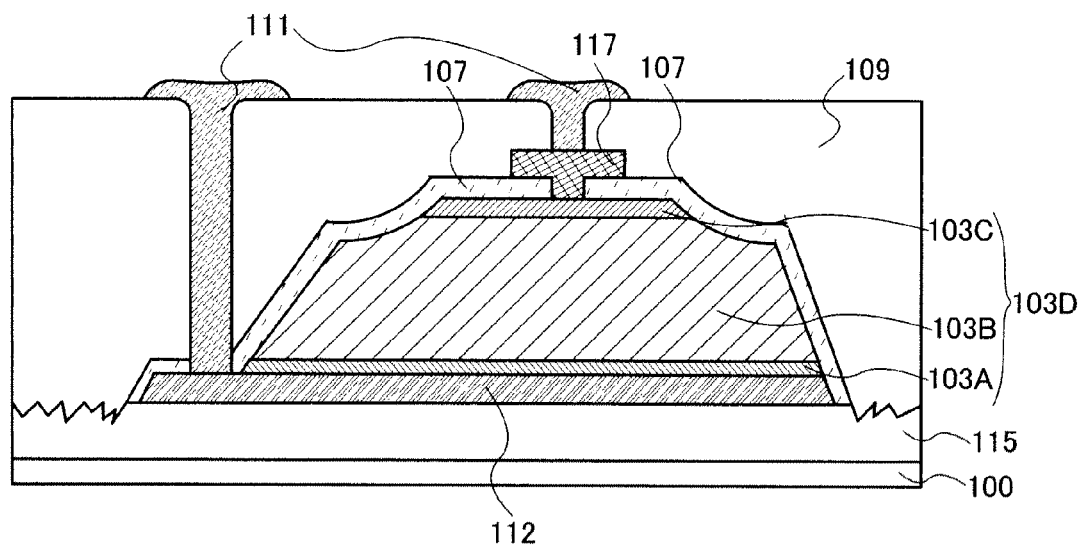
FIGS. 3A and 3B are cross-sectional views of a photoelectric conversion element of the present invention.
Figure 3B:
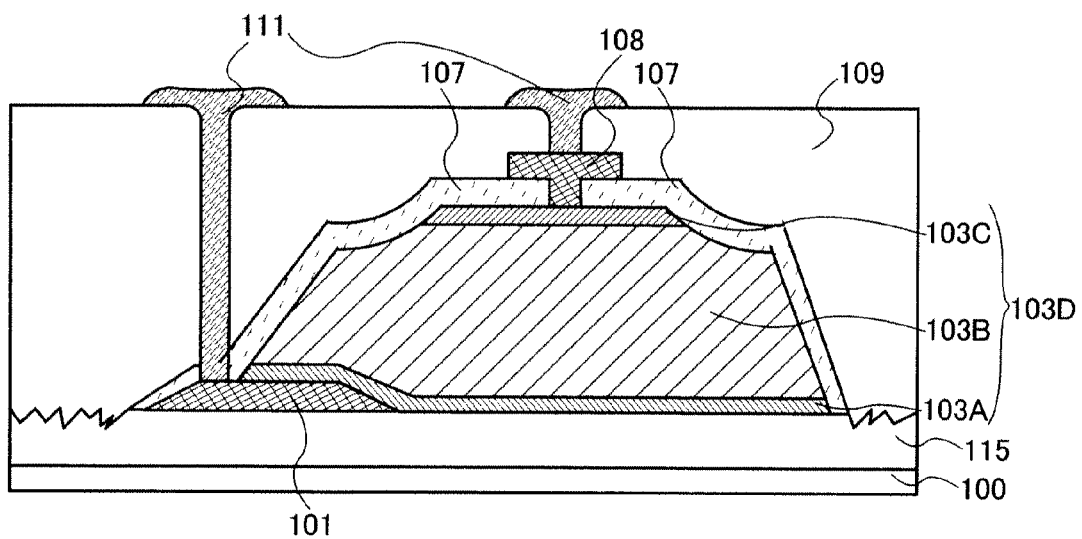
Figure 4A:
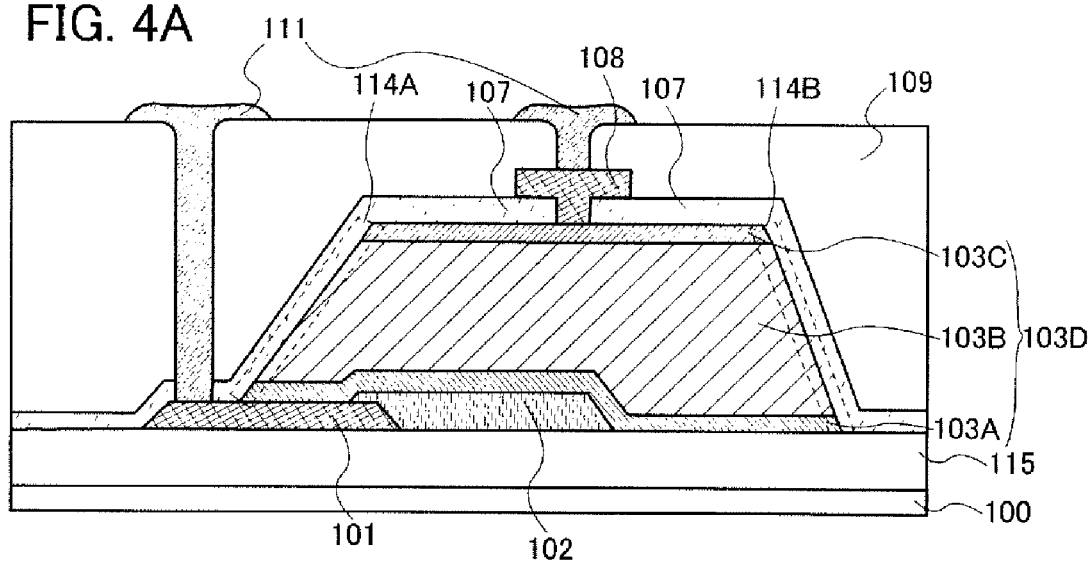
FIGS. 4A and 4B are cross-sectional views of a conventional photoelectric conversion element.
Figure 4B:
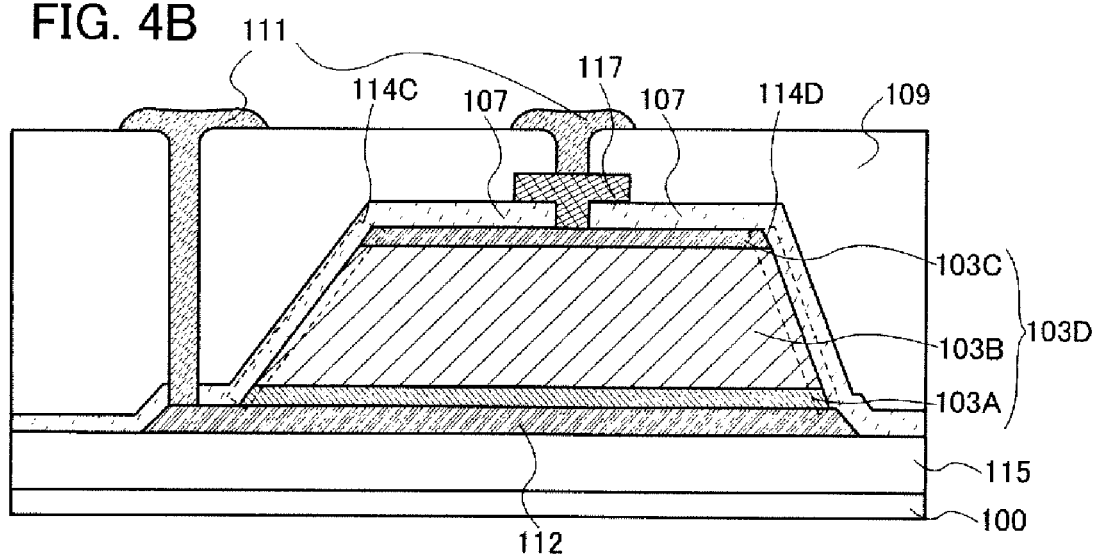

In this embodiment mode, a photoelectric conversion element with a structure different from that of Embodiment Mode 1 is described with reference to FIGS. 3A to 4B. FIGS. 3A and 3B illustrate cross sections of a photoelectric conversion element of the present invention. FIGS. 4A and 4B illustrate cross sections of a conventional photoelectric conversion element.

FIG. 3A illustrates an example of the photoelectric conversion element manufactured in accordance with the present invention. This photoelectric conversion element is different from the photoelectric conversion element described in Embodiment Mode 1 in that the first conductive layer 112 is formed of a light-transmitting conductive material. Note that in this embodiment mode, although a light-transmitting conductive material is not used for the second conductive layer 117, the second conductive layer 117 may be formed of a light-transmitting conductive material.

As a light-transmitting conductive material, ITO (indium tin oxide), IZO (indium tin oxide containing zinc oxide (ZnO)), or ZnO (zinc oxide) can be used. ITSO (indium tin oxide containing silicon oxide ($SiO_2$)) which is formed with use of a target of ITO containing 2 to 10 wt % of silicon oxide by a sputtering method is preferably used. Note that IZO is an oxide conductive material containing silicon oxide, which is formed with use of a target of indium oxide containing 2 to 20 wt % of ZnO by a sputtering method. Also, a conductive material in which ZnO is doped with gallium (Ga), $SnO_2$ (tin oxide), ZnO doped with $Ga_2O_3$, ZnO doped with $Al_2O_3$, or ZnO doped with $SiO_2$ may be used.

When the first conductive layer 112 is formed with use of a light-transmitting conductive material, a structure shown in FIG. 3A can be employed to form a photoelectric conversion device in which light is taken from the substrate side. In this case, a light-transmitting conductive material is not necessarily used for the second conductive layer 117.

In a conventional structure shown in FIG. 4B, there is a defect that breakage due to static electricity is likely to occur since its internal resistance is low compared with FIG. 4A. In addition, in the structure shown in FIG. 4B, there is a problem in that leakage current is likely to be generated since an etching residue generated in an etching step is easily deposited in the regions 114C and 114D surrounded by the dotted lines, which are end portions of the semiconductor layer.

FIG. 3B illustrates a cross-sectional view of a case in which a taper angle of the first conductive layer 101 is smaller than that of another structure of the present invention. With such a small taper angle of the first conductive layer 101, a film to be formed over the first conductive layer is favorably formed. Thus, a crack and the like which may be generated because the first conductive layer 101 and the semiconductor layer 103D are not formed favorably can be prevented, and leakage current can be reduced. As shown in FIG. 3B, when the present invention is applied to a photoelectric conversion element with its first conductive layer having a small taper angle of the side surface in the end portion, a highly reliable pin photoelectric conversion element can be manufactured even if a protective layer is not formed over the first conductive layer.

An etching condition may be adjusted in order to reduce a taper angle as shown in FIG. 3B. For example, etching is conducted with a gas flow rate of 70:10 (sccm), and a pressure in a chamber of 1.35 Pa. An RF electric (13.56 MHz) power of 600 W is applied to a coiled electrode to generate plasma and an RF electric (13.56 MHz) power of 200 W is applied to the substrate side, so that negative bias power is substantially applied and self-bias voltage is generated. Thus, the first conductive layer 101 has a taper angle of approximately 30°, which is favorable. Here, a resist is hard baked too.

The foregoing problem can be solved by applying the present invention: removing the region of the third semiconductor layer 103C exposed from a mask on the side surface in the end portion and a part of the second semiconductor layer 103B, or removing only the region of the third semiconductor layer 103C exposed from the mask on the side surface in the end portion so that the semiconductor layer 103D has two taper-shape portions with different taper angles in the end portion, and one of the taper shape portions does not include an n-layer on its sides surface.

When the present invention is applied to form two taper-shape portions with different taper angles on the side surface in the end portion of the semiconductor layer, a distance from the first semiconductor layer to the third semiconductor layer on the side surface in the end portion can be larger. Accordingly, leakage current due to conduction through the etching residue can be reduced. In addition, in processing of two taper-shape portions with different taper angles on a side surface in the end portion so that one of the taper-shape portions does not include an n-layer, over etching is conducted in an etching step of removing the region of the third semiconductor layer exposed from a mask and a part of the side surface in the end portion of the second semiconductor layer, or removing only the region of the third semiconductor layer exposed from the mask and etching is conducted to form unevenness in the base layer. Thus, adhesion of a resin film or the like to be formed over the base layer to have a thickness more than a depth of the unevenness can be improved.

Further, as described in this embodiment mode, it is possible not to provide a protective layer covering the end portion of the first conductive layer by reducing the taper angle of the side surface in the end portion of the first conductive layer, so that a manufacturing process is simplified. In addition, since leakage current is reduced with the present invention, a structure in which the first conductive layer is provided under the whole surface of a bottom surface of the first semiconductor layer can be employed.

With the present invention, a photoelectric conversion element with a resin film or the like having high adhesion formed between layers and with small leakage current can be obtained. Therefore, a highly reliable pin photoelectric conversion element can be manufactured. Further, a highly reliable electronic appliance including the pin photoelectric conversion element can be manufactured.

Note that this embodiment mode can be freely combined with another embodiment mode and Embodiments 1 to 3.

Embodiment Mode 3

In this embodiment mode, a color sensor to which the present invention is applied is described with reference to FIGS. 8 to 13, 19A, and 19B. Note that a structure is not limited to those shown in FIGS. 8 to 13. For example, in FIGS. 8 to 13, a conductive layer and an insulating layer are formed by a single layer, but it is not limited thereto. The conductive layer and the insulating layer in this embodiment mode may be a stacked layer. In addition, a light blocking layer and an overcoat layer may also have a single layer or a stacked layer.

Note that a material for the light blocking layer is note particularly limited as long as it can blocks visible light. For example, the light blocking layer may be an insulating film with a light blocking property, in which a carbon-based material or a pigment is diffused. Alternatively, the light blocking layer may be a metal layer and formed by a film in which, for example, chromium (Cr), chromium oxide, and chromium nitride are stacked.

Figure 8:
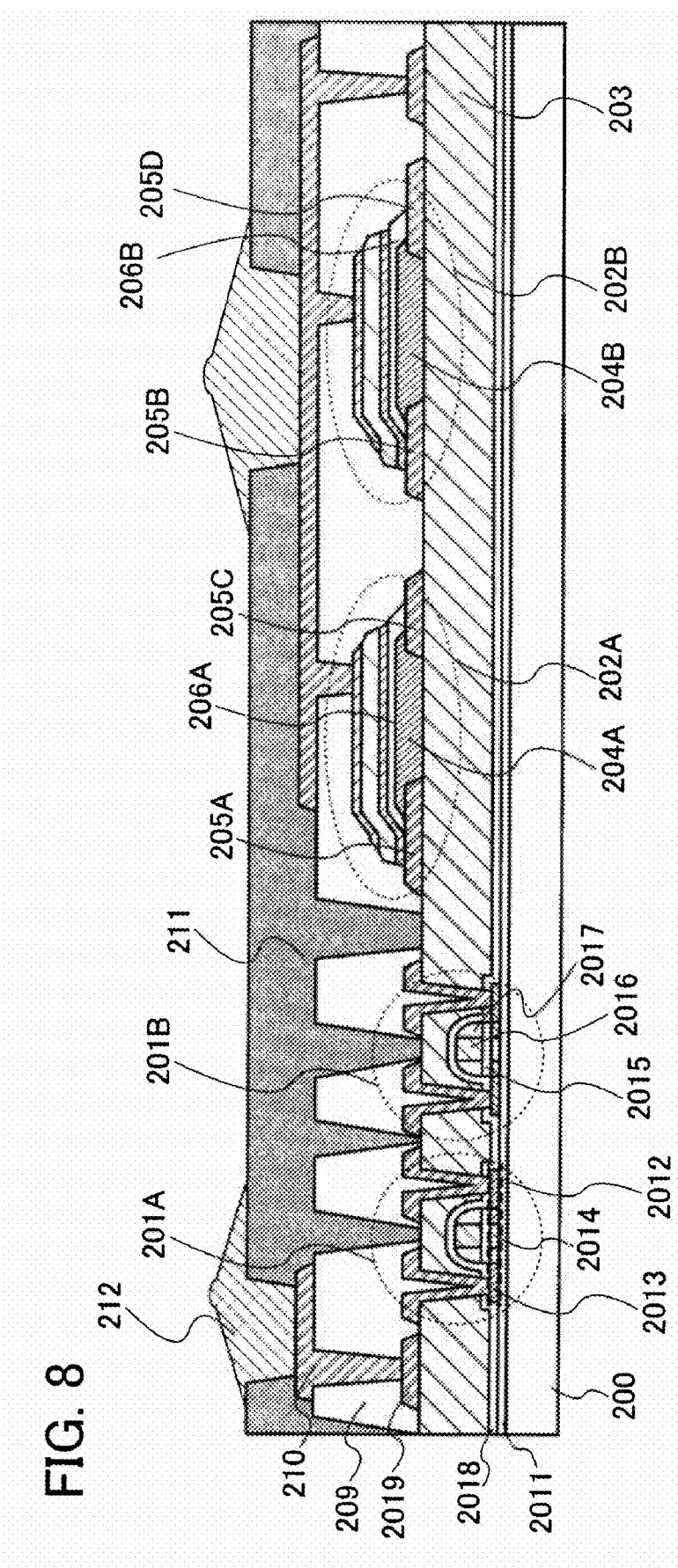
FIG. 8 is a cross-sectional view of a photoelectric conversion device of the present invention.

FIG. 8 illustrates a cross-sectional view of a photoelectric conversion device which includes a TFT 201A and a TFT 201B formed over a substrate 200, a photoelectric conversion element portion 202A and a photoelectric conversion element portion 202B formed over an interlayer insulating layer 203, a color filter layer 204A and a color filter layer 204B in the photoelectric conversion element portion 202A and the photoelectric conversion element portion 202B, a light blocking layer 205C and a light blocking layer 205D formed of the same kind of material as a first conductive layer 205A and a first conductive layer 205B in the photoelectric conversion element portion 202A and the photoelectric conversion element portion 202B. Since the first conductive layer 205A, the light blocking layer 205C, the first conductive layer 205B, and the light blocking layer 205D block light, light entering the photoelectric conversion layers from end portions of the photoelectric conversion element portion 202A and the photoelectric conversion element portion 202B can be blocked, and only light which is transmitted through the color filter layer 204A and the color filter layer 204B enters the photoelectric conversion layer. Accordingly, the photoelectric conversion element portions 202A and 202B can operate as color sensors. Colors of the color filter layers 204A and 204B can be different from each other. In addition, the color filter layer 204A and an overcoat layer 206A, and the color filter layer 204B and an overcoat layer 206B operate similarly to the protective layer 102 described in Embodiment Mode 1. The overcoat layers 206A and 206B protect the photoelectric conversion layers so that impurity elements in the color filter layers 204A and 204B are not diffused in the photoelectric conversion layers. In addition, a conductive layer 210 over an insulating layer 209 is connected to a contact electrode 212. The contact electrode 212 is covered with a resin 211 except for its exposed portion. Note that the conductive layer 210 may be connected to the photoelectric conversion element portion 202A and a photoelectric conversion element portion 202B through another conductive layer. The conductive layer 210 and a conductive layer 2019 may be connected through another conductive layer.

Figure 9:
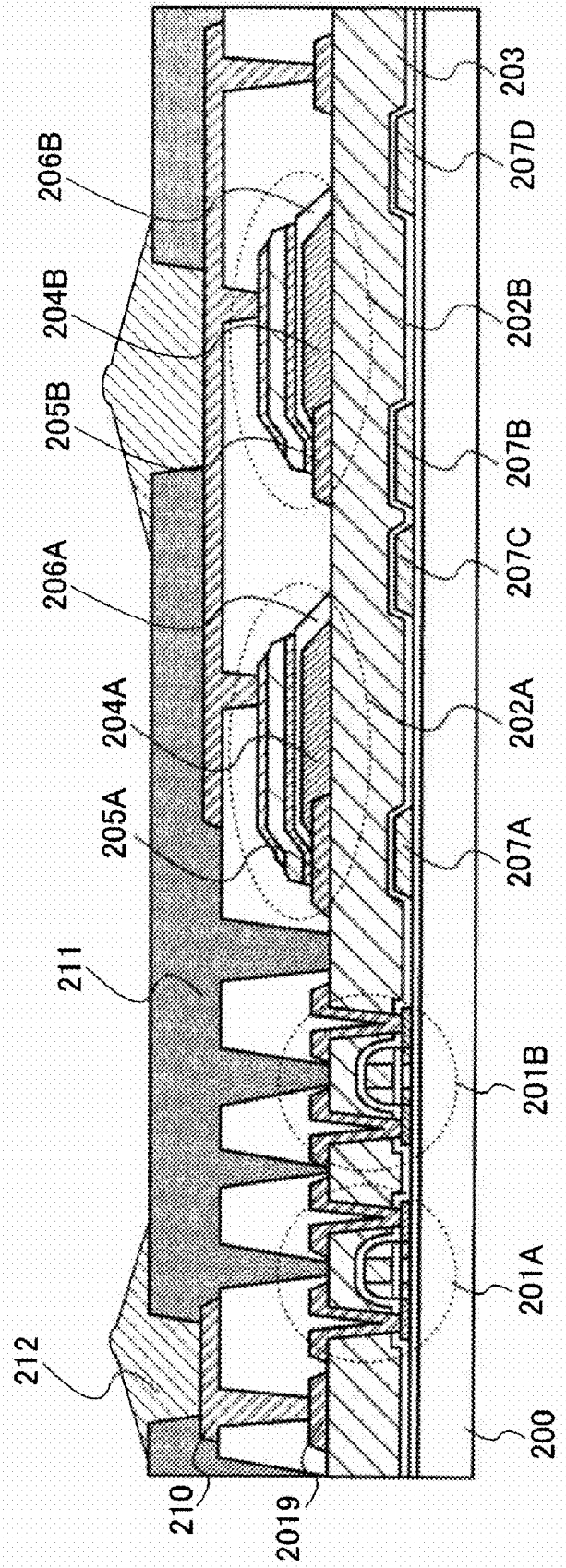
FIG. 9 is a cross-sectional view of a photoelectric conversion device of the present invention.

FIG. 9 illustrates a cross-sectional view of a photoelectric conversion device which includes the TFT 201A and the TFT 201B formed over the substrate 200, the photoelectric conversion element portion 202A and the photoelectric conversion element portion 202B formed over the interlayer insulating layer 203, the color filter layer 204A and the color filter layer 204B in the photoelectric conversion element portion 202A and the photoelectric conversion element portion 202B, and a light blocking layer 207A, a light blocking layer 207B, a light blocking layer 207C, and a light blocking layer 207D under the interlayer insulating layer 203 which is provided with the photoelectric conversion element portion 202A and the photoelectric conversion element portion 202B. Since the light blocking layers 207A to 207D block light, light entering the photoelectric conversion layers from end portions of the photoelectric conversion element portions 202A and 202B can be blocked, and only light which is transmitted through the color filter layer 204A or the color filter layer 204B enters the photoelectric conversion layer. Accordingly, the photoelectric conversion element portions 202A and 202B can operate as color sensors. Colors of the color filter layers 204A and 204B can be different from each other. In addition, the color filter layer 204A and the overcoat layer 206A, and the color filter layer 204B and the overcoat layer 206B operate similarly to the protective layer 102 described in Embodiment Mode 1. The overcoat layers 206A and 206B protect the photoelectric conversion layers so that impurity elements in the color filter layers 204A and 204B are not diffused in the photoelectric conversion layers. In addition, the conductive layer 210 over the insulating layer 209 is connected to the contact electrode 212. The contact electrode 212 is covered with the resin 211 except for its exposed portion. Note that the conductive layer 210 and the photoelectric conversion element portion 202A, and the conductive layer 210 and the photoelectric conversion element portion 202B may be connected through another conductive layer. The conductive layer 210 and the conductive layer 2019 may be connected through another conductive layer. Note that the light blocking layers 207A to 207D may be formed of a similar material to and in the same step as a conductive layer or the like in the TFTs 201A and 201B.

Figure 10:
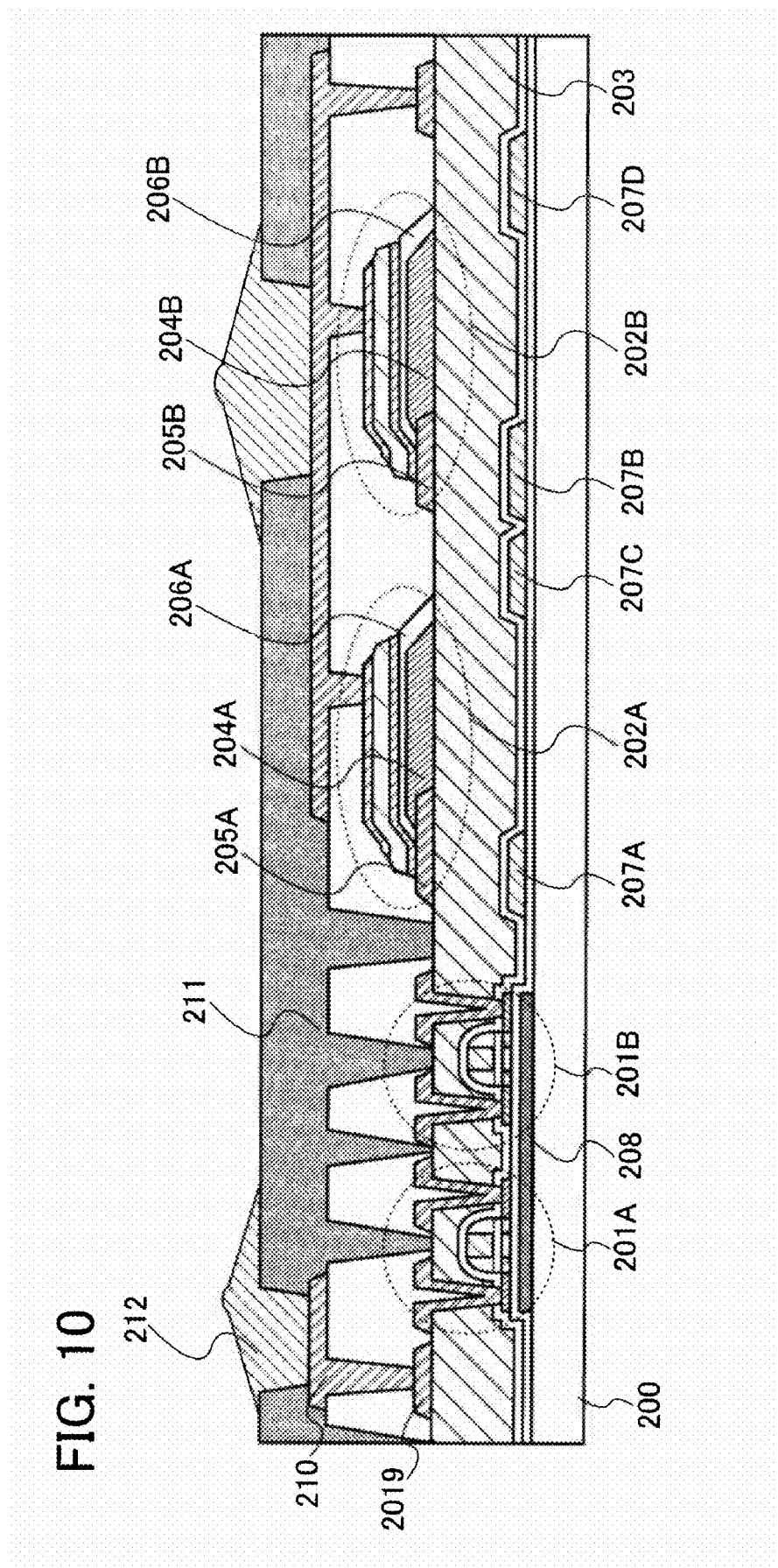
FIG. 10 is a cross-sectional view of a photoelectric conversion device of the present invention.

FIG. 10 illustrates a cross-sectional view of a photoelectric conversion device which includes the TFTs 201A and 201B formed over the substrate 200, the photoelectric conversion element portions 202A and 202B formed over the interlayer insulating layer 203, the color filter layers 204A and 204B in the photoelectric conversion element portions 202A and 202B, a light blocking layer 208 under the TFTs 201A and TFT 201B, and the light blocking layers 207A to 207D under the interlayer insulating layer 203 which is provided with the photoelectric conversion element portions 202A and 202B.

Since the light blocking layers 207A to 207D block light, light entering the photoelectric conversion layers from end portions of the photoelectric conversion element portion 202A and the photoelectric conversion element portion 202B can be blocked, and only light which is transmitted through the color filter layer 204A or the color filter layer 204B enters the photoelectric conversion layer. Accordingly, the photoelectric conversion element portions 202A and 202B can operate as color sensors. Colors of the color filter layers 204A and 204B can be different from each other. In addition, the color filter layer 204A and the overcoat layer 206A, and the color filter layer 204B and the overcoat layer 206B operate similarly to the protective layer 102 described in Embodiment Mode 1. The overcoat layers 206A and 206B protect the photoelectric conversion layers so that impurity elements in the color filter layers 204A and 204B are not diffused in the photoelectric conversion layers. In addition, the conductive layer 210 over the insulating layer 209 is connected to the contact electrode 212. The contact electrode 212 is covered with the resin 211 except for its exposed portion. Since the TFTs 201A and 201B include the light blocking layer 208, highly reliable TFTs can be obtained. Note that the conductive layer 210 and the photoelectric conversion element portion 202A, and the conductive layer 210 and the photoelectric conversion element portion 202B may be connected through another conductive layer. The conductive layer 210 and the conductive layer 2019 may be connected through another conductive layer. Note that the light blocking layers 207A to 207D may be formed of a similar material to and in the same step as a conductive layer or the like in the TFTs 201A and 201B.

Figure 11:
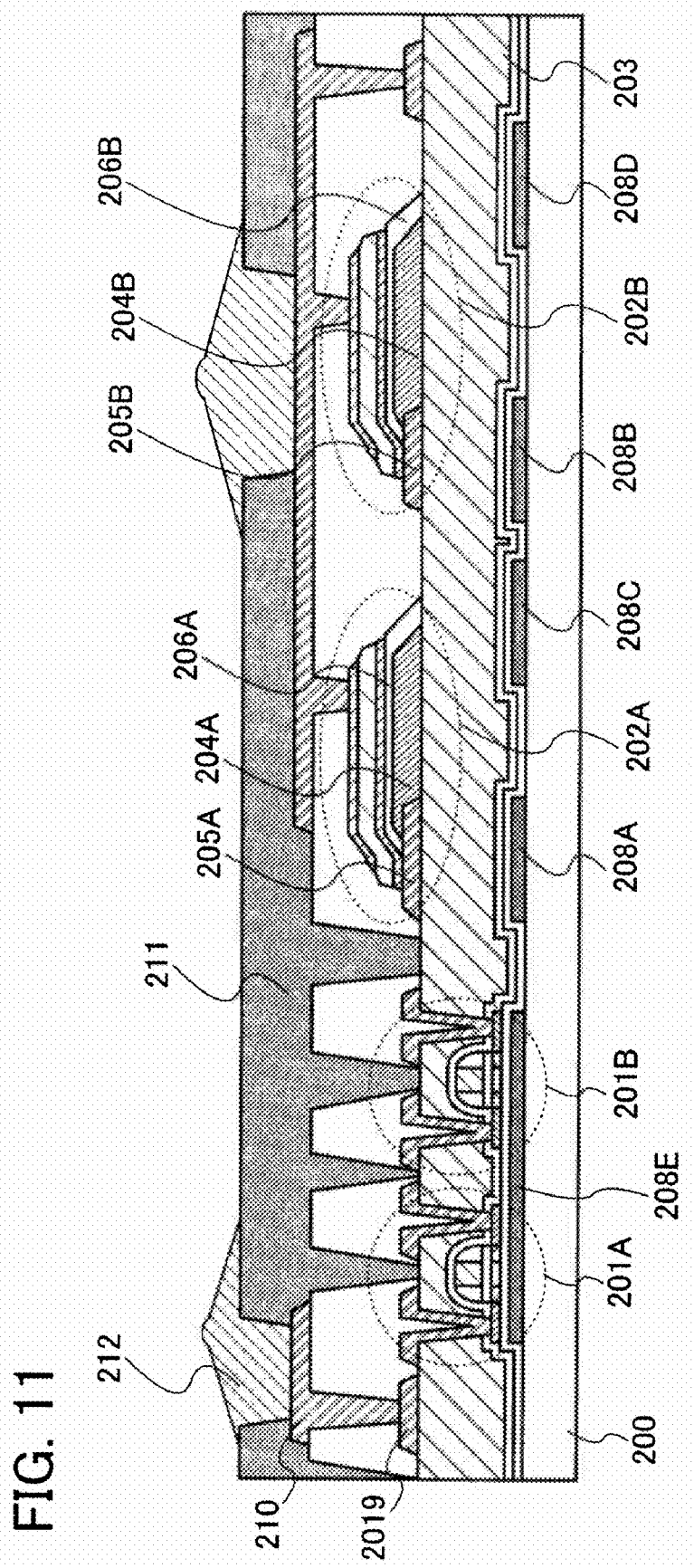
FIG. 11 is a cross-sectional view of a photoelectric conversion device of the present invention.

FIG. 11 illustrates a cross-sectional view of a photoelectric conversion device which includes the TFT 201A and the TFT 201B formed over the substrate 200, the photoelectric conversion element portion 202A and the photoelectric conversion element portion 202B formed over the interlayer insulating layer 203, the color filter layer 204A and the color filter layer 204B in the photoelectric conversion element portion 202A and the photoelectric conversion element portion 202B, a light blocking layer 208E under the TFT 201A and the TFT 201B, and a light blocking layer 208A, a light blocking layer 208B, a light blocking layer 208C, and a light blocking layer 208D under the interlayer insulating layer 203 which is provided with the photoelectric conversion element portion 202A and the photoelectric conversion element portion 202B. Since the light blocking layers 208A to 208D block light, light entering the photoelectric conversion layers from end portions of the photoelectric conversion element portion 202A and the photoelectric conversion element portion 202B can be blocked, and only light which is transmitted through the color filter layer 204A or the color filter layer 204B enters the photoelectric conversion layer. Accordingly, the photoelectric conversion element portions 202A and 202B can operate as color sensors. Colors of the color filter layers 204A and 204B can be different from each other. In addition, the color filter layer 204A and the overcoat layer 206A, and the color filter layer 204B and the overcoat layer 206B operate similarly to the protective layer 102 described in Embodiment Mode 1. The overcoat layers 206A and 206B protect the photoelectric conversion layers so that impurity elements in the color filter layers 204A and 204B are not diffused in the photoelectric conversion layers. In addition, the conductive layer 210 over the insulating layer 209 is connected to the contact electrode 212. The contact electrode 212 is covered with the resin 211 except for its exposed portion. Since the TFTs 201A and 201B includes the light blocking layer 208E, highly reliable TFTs can be obtained. The light blocking layer 208E is preferably formed of a similar material to and in the same step as the light blocking layers 208A to 208D. Note that the conductive layer 210 and the photoelectric conversion element portion 202A, and the conductive layer 210 and the photoelectric conversion element portion 202B may be connected through another conductive layer. The conductive layer 210 and the conductive layer 2019 may be connected through another conductive layer.

Figure 12:
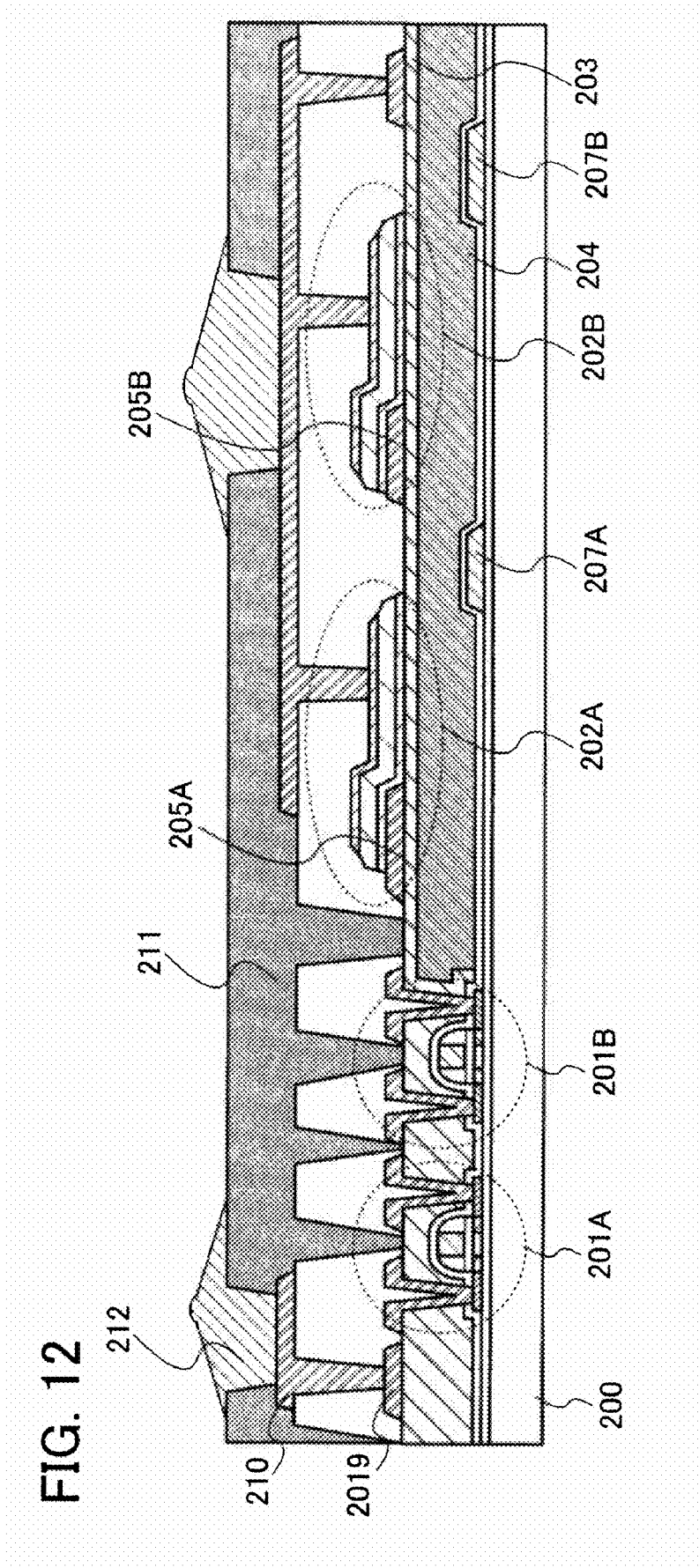
FIG. 12 is a cross-sectional view of a photoelectric conversion device of the present invention.

FIG. 12 illustrates a cross-sectional view of a photoelectric conversion device which includes the TFT 201A and the TFT 201B formed over the substrate 200, the photoelectric conversion element portion 202A and the photoelectric conversion element portion 202B formed over the interlayer insulating layer 203, a color filter layer 204 under the interlayer insulating layer 203, and the light blocking layer 207A and the light blocking layer 207B under the interlayer insulating layer 203 which is provided with the photoelectric conversion element portion 202A and the photoelectric conversion element portion 202B and under the color filter layer 204. Since the first conductive layers 205A and 205B and the light blocking layers 207A and 207B block light, light entering the photoelectric conversion layers from end portions of the photoelectric conversion element portion 202A and the photoelectric conversion element portion 202B can be blocked. Accordingly, the photoelectric conversion element portions 202A and 202B can operate as color sensors. The interlayer insulating layer 203 protects the photoelectric conversion layers in the photoelectric conversion element portions 202A and 202B so that impurity elements in the color filter layer 204 are not diffused in the photoelectric conversion layers. In addition, the conductive layer 210 over the insulating layer 209 is connected to the contact electrode 212. The contact electrode 212 is covered with the resin 211 except for its exposed portion. Although not shown in FIG. 12, the TFT 201A and the TFT 201B may have a light blocking layer as in FIGS. 10 and 11. Note that since the color filter layer 204 has a single color in FIG. 12, the light blocking layer 207A does not need to be formed if not necessary. Note that the conductive layer 210 and the photoelectric conversion element portion 202A, and the conductive layer 210 and the photoelectric conversion element portion 202B may be connected through another conductive layer. The conductive layer 210 and the conductive layer 2019 may be connected through another conductive layer.

Figure 13:
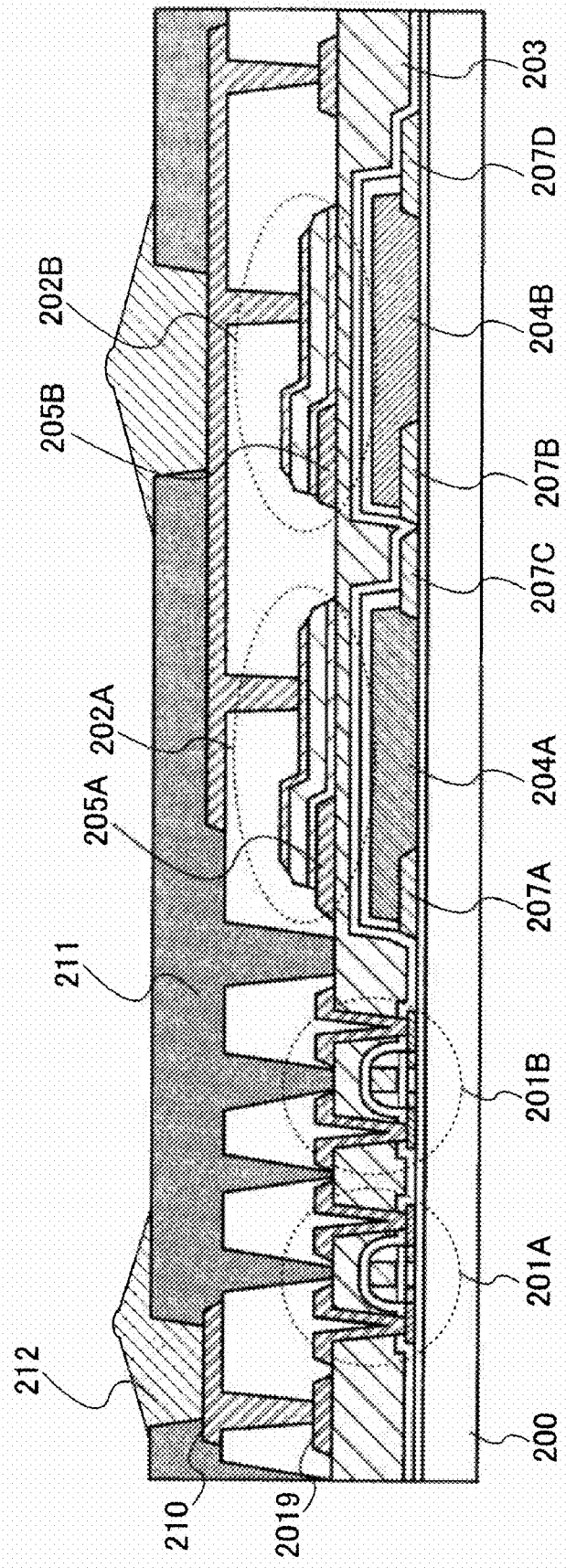
FIG. 13 is a cross-sectional view of a photoelectric conversion device of the present invention.

FIG. 13 illustrates a cross-sectional view of a photoelectric conversion device which includes the TFT 201A and the TFT 201B formed over the substrate 200, the photoelectric conversion element portion 202A and the photoelectric conversion element portion 202B formed over the interlayer insulating layer 203, the color filter layer 204A and the color filter layer 204B under the interlayer insulating layer 203, and the light blocking layer 207A, the light blocking layer 207C, the light blocking layer 207B, and the light blocking layer 207D under the interlayer insulating layer 203 which is provided with the photoelectric conversion element portion 202A and the photoelectric conversion element portion 202B and under the color filter layer 204A and the color filter layer 204B. The photoelectric conversion element portion 202A and the photoelectric conversion element portion 202B include the first conductive layer 205A and the first conductive layer 205B. Since the light blocking layers 207A to 207D block light, light entering the photoelectric conversion layers from end portions of the photoelectric conversion element portion 202A and the photoelectric conversion element portion 202B can be blocked, and only light which is transmitted through the color filter layer 204A or the color filter layer 204B enters the photoelectric conversion layer. Accordingly, the photoelectric conversion element portions 202A and 202B can operate as color sensors. Colors of the color filter layers 204A and 204B can be different from each other. The interlayer insulating layer 203 protects the photoelectric conversion layers in the photoelectric conversion element portions 202A and 202B so that impurity elements in the color filter layers 204A and 204B are not diffused in the photoelectric conversion layers in the photoelectric conversion element portions 202A and 202B. In addition, the conductive layer 210 over the insulating layer 209 is connected to the contact electrode 212. Although not shown in FIG. 13, the TFT 201A and the TFT 201B may have a light blocking layer as in FIGS. 10 and 11. Note that the conductive layer 210 and the photoelectric conversion element portion 202A, and the conductive layer 210 and the photoelectric conversion element portion 202B may be connected through another conductive layer. The conductive layer 210 and the conductive layer 2019 may be connected through another conductive layer. Note that the light blocking layers 207A to 207D may be formed of a similar material to and in the same step as a conductive layer or the like in the TFTs 201A and 201B.

Here, an example of a manufacturing process of the TFTs 201A and 201B of this embodiment mode is described with reference to FIG. 8.

First, an insulating layer 2011 is formed over the substrate 200. Then, a layer including a plurality of transistors is formed over the insulating layer 2011. Subsequently, an insulating layer 2018 and the interlayer insulating layer 203 are formed over the layer including the plurality of transistors. Then, a conductive layer 2019 which is connected to a source region or a drain region of each transistor through openings formed in an insulating layer 2015, the insulating layer 2018, and the interlayer insulating layer 203 in the plurality of transistor, is formed.

The insulating layer 2011 prevents intrusion of impurity from the substrate 200. The insulating layer 2011 is formed by a single layer or a stacked layer of a silicon oxide-based film or a silicon nitride-based film by a sputtering method, a plasma CVD method, or the like. Note that the insulating layer 2011 does not need to be formed if not necessary.

Each of the transistors has a semiconductor layer 2012, the insulating layer 2015, and a conductive layer 2016 serving as a gate electrode. Here, silicon is used for the semiconductor layer 2012. The semiconductor layer 2012 can be formed of an amorphous semiconductor with use of a semiconductor material gas such as silane ($SiH_4$) by an LPCVD method, a plasma CVD method, a chemical vapor deposition method, or a sputtering method. Alternatively, a polycrystalline semiconductor crystallized by a laser crystallization method, a thermal crystallization method, or a thermal crystallization method using an element promoting crystallization such as nickel, or the like may be used. Further alternatively, SAS or the like may be used. Here, polycrystalline silicon is used.

The semiconductor layer 2012 includes an impurity region 2013 serving as a source region or a drain region, and a channel formation region 2014. An impurity element imparting n-type conductivity (an element belonging to Group 15, such as phosphorus or arsenic), or an impurity element imparting p-type conductivity (such as boron or aluminum) is added to the impurity region 2013. A method using a diffuse source, an ion injecting method, or the like may be used for introducing an impurity. An LDD (Lightly Doped Drain) region is preferably provided between the channel forming region and a source region or a drain region, but not needed if not necessary.

Note that an LDD region is a region formed for improving reliability of a TFT having a semiconductor layer of polycrystalline silicon. In a TFT having a semiconductor layer of polycrystalline silicon, it is necessary to suppress off current. In particular, when the TFT is used as an analog switch in a pixel circuit and the like, the off current thereof needs to be sufficiently low. However, there is leakage current through defects in an off state due to a reverse bias strong electric field at a drain junction portion. When an LDD region is provided, an electric field in the vicinity of an end of the drain is relaxed, so that off current can be reduced. Further, since a reverse bias strong electric field at the drain junction portion can be diffused to a junction portion of a channel region and an LDD region and to a junction point of the LDD region and a drain region, an electric field is relaxed and the leakage current is reduced.

In this embodiment mode, an LDD region can be formed by providing an insulating layer 2017 serving as a side wall.

The insulating layer 2015 serves as a gate insulating layer. The insulating layer 2015 may be formed, similarly to the insulating layer 2011, of a silicon oxide-based material or a silicon nitride-based material to be a single layer or a stacked layer.

The insulating layer 2018 and the interlayer insulating layer 203 are formed of an inorganic material or an organic material to be a single layer or a stacked layer by a SOG (Spin On Glass) method, a droplet discharging method, a screen printing method, or the like. For example, the insulating layer 2018 may be formed of a silicon oxynitride and the interlayer insulating layer 203 may be formed of nitride oxide silicon. In addition, the insulating layer 2018 and the interlayer insulating layer 203 may be formed of a sputtering method, a plasma CVD method, or the like, similarly to the insulating layer 2011 and the insulating layer 2015.

The conductive layer 2019 is formed of a conductive substance with used of a CVD method, a sputtering method, a droplet discharging method, or the like. The conductive layer 2019 may be formed by a single layer or a stacked layer. The first conductive layer 205A in the photoelectric conversion element portion may be formed at the same step.

Although a shape of the contact electrode 212 is not limited to the shapes shown in FIGS. 8 to 13, the shape shown is preferable. In other words, the contact electrode 212 has a surface with a small taper angle with which a thickness of the contact electrode 212 is increased from the end portion to a center portion, and the contact electrode 212 has a projection at the center portion, which is continuous to the surface having the taper angle. With such a shape, the contact electrode 212 can reliably connected an external circuit to which the contact electrode is connected and a semiconductor device including a photoelectric conversion element, compared to a conventional one, thereby improving a yield.

Note that structures of the TFT 201A and the TFT 201B described above are not limited to those shown in the drawing and various structures can be applied. For example, although the TFT shown is a top gate type, a back-channel-etch type or a channel protective type TFT may be used.

Figure 19A:
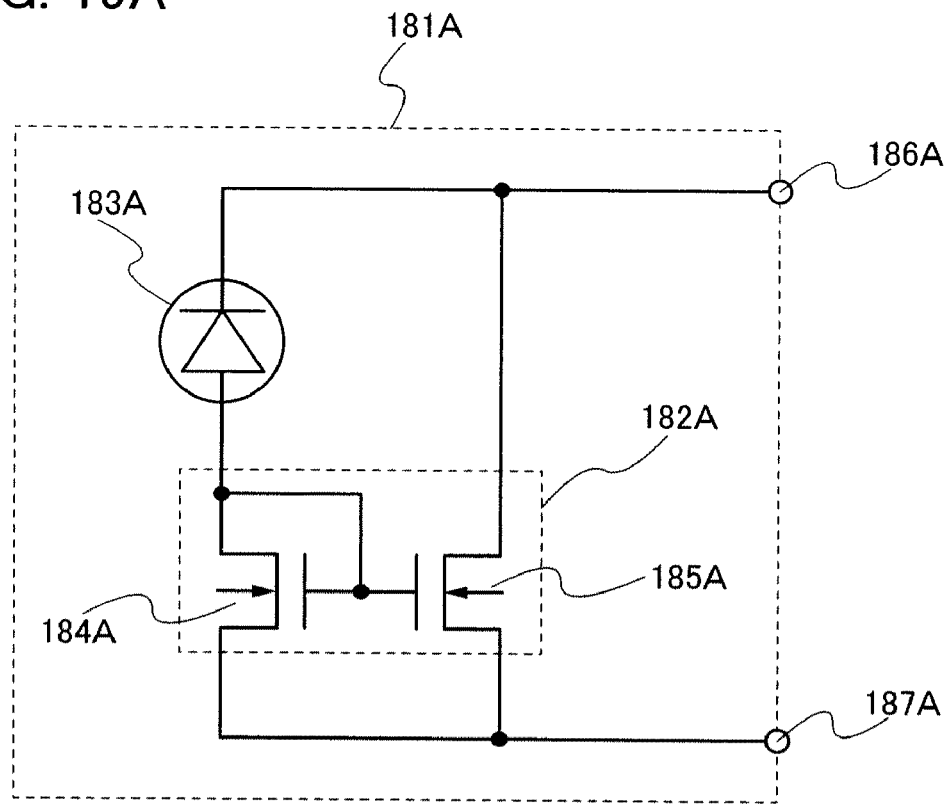
FIGS. 19A and 19B are diagrams each showing a circuit of a photoelectric conversion device of the present invention.
Figure 19B:
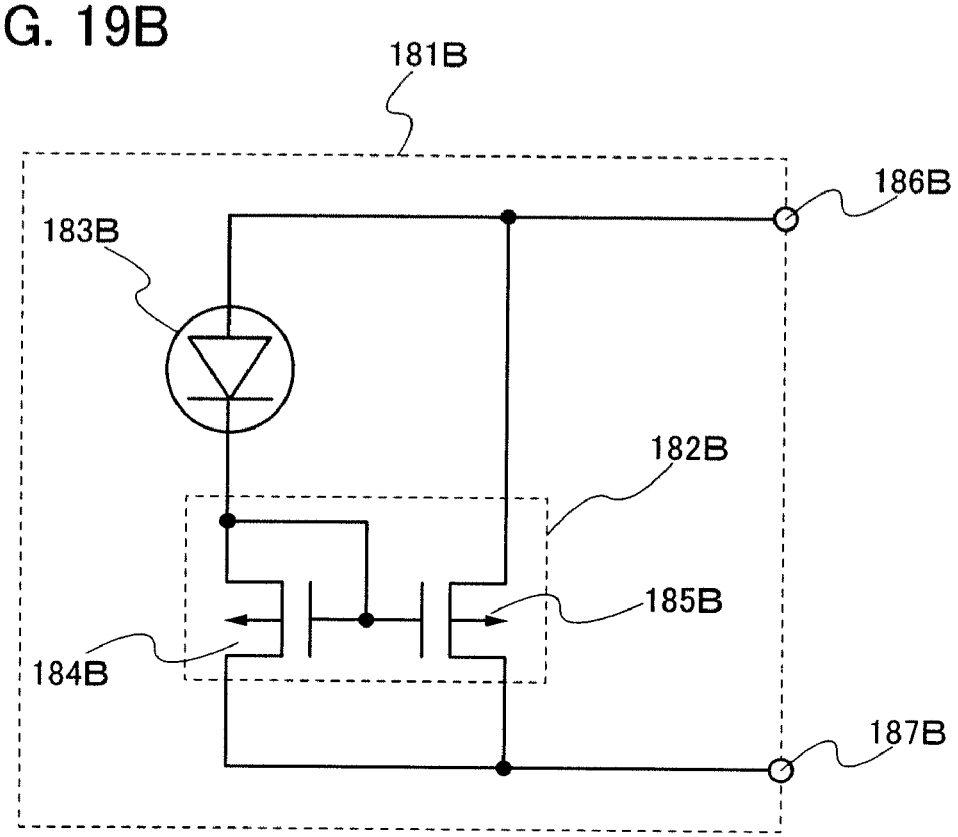

Further, as clearly shown in drawings, a semiconductor device described in this embodiment mode favorably has the TFT and the photoelectric conversion element formed over one substrate. FIGS. 19A and 19B are circuit diagrams illustrating an example of the structure. A semiconductor device shown in each of FIGS. 19A and 19B has a photoelectric conversion element and a current amplifier circuit including a TFT. FIG. 19A illustrates an example in which an n-type TFT is used and FIG. 19B illustrates an example in which a p-type TFT is used. The following description is made with reference to FIG. 19A, but it is also applied to a case of using a p-type TFT.

A semiconductor device 181A in FIG. 19A includes a current amplifier circuit 182A which amplifies an output of the photoelectric conversion element 183A. Various circuit structures can be applied to the current amplifier circuit 182A. Here, the current amplifier circuit 182A includes an n-type TFT 184A and an n-type TFT 185A to form a current mirror circuit. Each of the n-type TFT 184A and the n-type TFT 185A has one of its source electrode and its drain electrode connected to an external power source terminal 187A and maintained at a constant voltage (such as a ground voltage). The other one of the source electrode and the drain electrode of the n-type TFT 185A is connected to an output terminal 186A. The other one of the source electrode and the drain electrode of the n-type TFT 184A is connected to a gate electrode of the n-type TFT 184A and a gate electrode of the n-type TFT 185A. In a case where a pin photodiode is used in the photoelectric conversion element 183A, an anode (p-type semiconductor side) is connected to the other one of the source electrode or the drain electrode of the n-type TFT 184A, and a cathode (n-type semiconductor side) is connected to the output terminal 186A.

When the photoelectric conversion element 183A is irradiated with light, photoelectric current flows from the anode (p-type semiconductor side) to the cathode (n-type semiconductor side). Thus, current flows into the n-type TFT 184A in the current amplifier circuit 182A, and voltage required to let the current flow is generated in the gate electrode. When the n-type TFT 185A and the n-type TFT 184A have the same gate length L and channel width W and operate in a saturation region, since gate voltage of the n-type TFT 184A and the n-type TFT 185A are the same, the same amount of current flows. When the output current needs to be amplified, n TFTs which are parallel connected may be used as the n-type TFT 185A. In that case, the current is amplified proportionally to the number (n) of the parallel connected TFTs.

A semiconductor device 181B shown in FIG. 19B includes a current amplifier circuit 182B which amplifies an output of a photoelectric conversion element 183B. Various kinds of circuit structures can be applied to the current amplifier circuit 182B. Here, the current amplifier circuit 182B includes a p-type TFT 184B and a p-type TFT 185B to form a current mirror circuit. Each of the p-type TFT 184B and the p-type TFT 185B has one of its source electrode or its drain electrode connected to an external power source terminal 187B and maintained at a constant voltage (such as a ground voltage). The other one of the source electrode and the drain electrode of the p-type TFT 185B is connected to an output terminal 186B. The other one of the source electrode or the drain electrode of the p-type TFT 184B is connected to a gate electrode of the p-type TFT 184B and a gate electrode of the p-type TFT 185B. In a case where a pin photodiode is used in the photoelectric conversion element 183B, an anode (p-type semiconductor side) is connected to the other one of the source electrode or the drain electrode of the p-type TFT 184B, and a cathode (n-type semiconductor side) is connected to the output terminal 186B.

When the photoelectric conversion element 183B is irradiated with light, photoelectric current flows from the anode (p-type semiconductor side) to the cathode (n-type semiconductor side). Thus, current flows into the p-type TFT 184B in the current amplifier circuit 182B, and voltage required to let the current flow is generated in the gate electrode. When the p-type TFT 185B and the p-type TFT 184B have the same gate length L and channel width W and operate in a saturation region, since gate voltage of the p-type TFT 184B and the p-type TFT 185B are the same, the same amount of current flows. When the output current needs to be amplified, n TFTs which are parallel connected may be used as the p-type TFT 185B. In that case, the current is amplified proportionally to the number (n) of the parallel connected TFTs.

As described above, with the present invention, a semiconductor element with a resin film or the like formed as an interlayer insulating film having high adhesion formed, and with small leakage current can be obtained. Accordingly, a highly reliable pin photoelectric conversion element can be manufactured. Therefore, a highly reliable semiconductor device including a pin photoelectric conversion element can be manufactured.

Note that this embodiment mode can be freely combined with another embodiment mode and Embodiments 1 to 3.

Embodiment 1

A sample, to which the present invention is applied, and in which a side surface in an end portion of the semiconductor layer has two surfaces with different taper angles, and a side surface in an end portion of the first semiconductor layer and a side surface in an end portion of the third semiconductor layer are not in the same plane, is observed with a scanning electron microscope (hereinafter, referred to as a SEM) and a transmission electron microscope (hereinafter, referred to as a TEM). The following description is made with reference to scanning electron microscope images (hereinafter, referred to as SEM image) shown in FIGS. 20A and 20B, and transmission electron microscope images (hereinafter, referred to as TEM image) shown in FIGS. 21A to 21C. Note that a STEM (Scanning Transmission Electron Microscope) is used to obtain the TEM images.

The sample of this embodiment includes a silicon oxide film formed over a substrate, photosensitive polyimide formed over the silicon oxide film, photosensitive acrylic formed over the photosensitive polyimide, and a p-type semiconductor layer, an i-type semiconductor layer, and an n-type semiconductor layer sequentially stacked over the photosensitive acrylic. Amorphous silicon is used for the i-type semiconductor layer, and SAS is used for the p-type semiconductor layer and the n-type semiconductor layer.

Glass is used for the substrate. First, the silicon oxide film is formed over the glass substrate by a CVD method to have a thickness of 200 nm. Note that the film formed here is not necessarily the silicon oxide film and may be a silicon oxide-based film other than the silicon oxide film, or a silicon nitride-based film.

Then, photosensitive polyimide and photosensitive acrylic are sequentially stacked over the silicon oxide-based film by a spin coating method.

Next, the p-layer is formed over the photosensitive acrylic. The p-layer is formed with use of silane ($SiH_4$) containing boron (B) by a plasma CVD method.

Subsequently, the i-layer is formed over the p-layer. The i-layer is formed with use of silane ($SiH_4$) by a plasma CVD method.

Then, the n-layer is formed over the i-layer. The n-layer is formed with use of silane ($SiH_4$) containing phosphorus (P) by a plasma CVD method. Thereafter, a resist is formed.

Then, three dry etchings (first to third etchings) are conducted to a stacked layer structure, which is formed.

The first etching is conducted with use of a mixed gas of $CF_4$ and $Cl_2$. Here, the etching is conducted with a gas flow rate of 40:40 (sccm), a pressure in a chamber of 2.0 Pa, and a temperature of 70° C., and an RF (13.56 MHz) electric power of 450 W is applied to a coiled electrode to generate plasma and an RF (13.56 MHz) electric power of 100 W is applied to the substrate side, so that negative bias power is substantially applied and self-bias voltage is generated.

The second etching is conducted with use of a mixed gas of $CF_4$ and $O_2$. Here, the etching is conducted with a gas flow rate of 45:55 (seem), a pressure in a chamber of 2.5 Pa, and a temperature of 70° C., and an RF (13.56 MHz) electric power of 500 W is applied to a coiled electrode to generate plasma and an RF (13.56 MHz) electric power of 200 W is applied to the substrate side, so that negative bias power is substantially applied and self-bias voltage is generated.

The third etching is conducted with use of a mixed gas of $CHF_3$ and He. Here, the etching is conducted with a gas flow rate of 7.5:142.5 (sccm), a pressure in a chamber of 5.5 Pa, and a temperature of 70° C., and an RF (13.56 MHz) electric power of 475 W is applied to a coiled electrode to generate plasma and an RF (13.56 MHz) electric power of 300 W is applied to the substrate side, so that negative bias power is substantially applied and self-bias voltage is generated.

With the foregoing steps, the pin layer in which a side surface in an end portion of the semiconductor layer has two surfaces with different taper angles, and a side surface in an end portion of the p-layer and a side surface in an end portion of the n-layer are not in the same plane can be obtained. As a post treatment, the resist is peeled to be removed by a predetermined chemical solution after ashing is conducted. Here, a chemical solution appropriate to the resist that is used may be used.

Figure 20A:
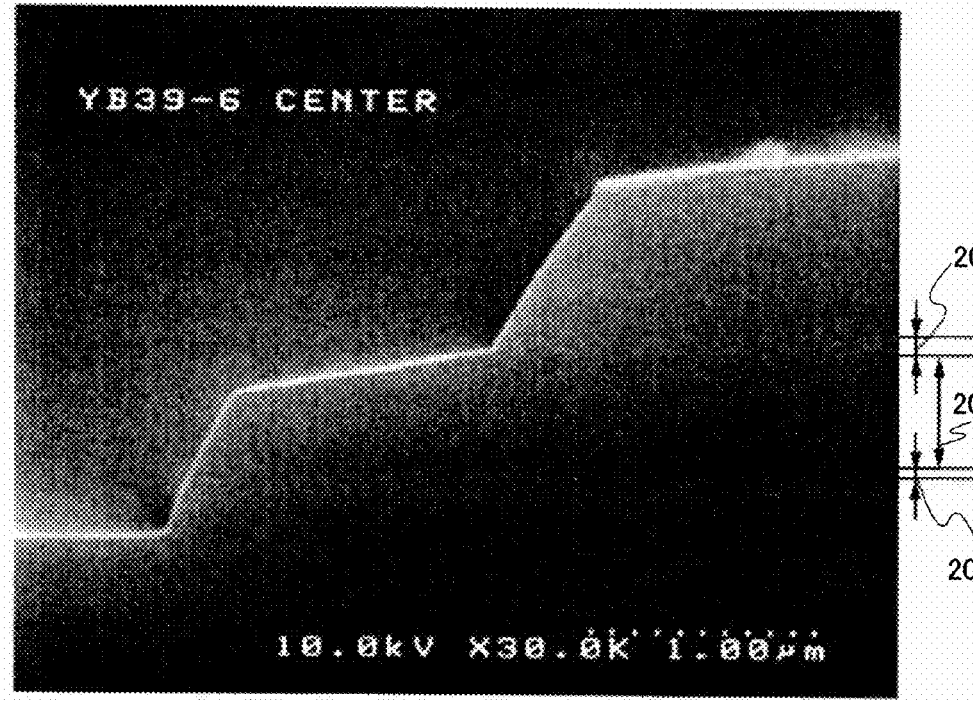
FIGS. 20A and 20B are diagrams each showing a shape of a photoelectric conversion element of the present invention with a SEM image.
Figure 20B:
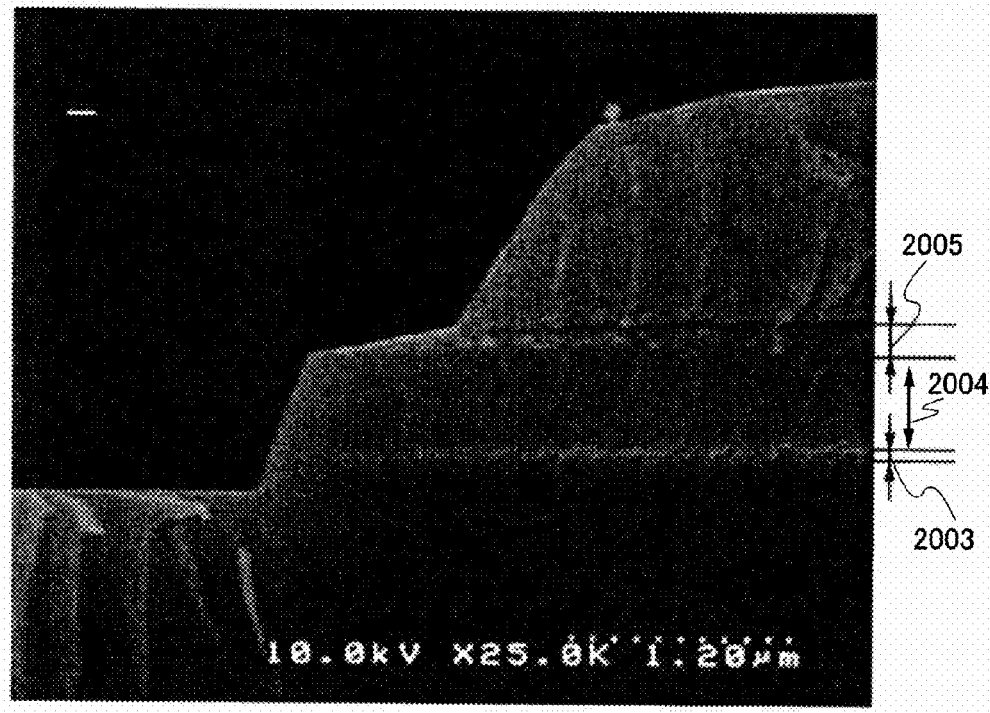
Figure 21A:
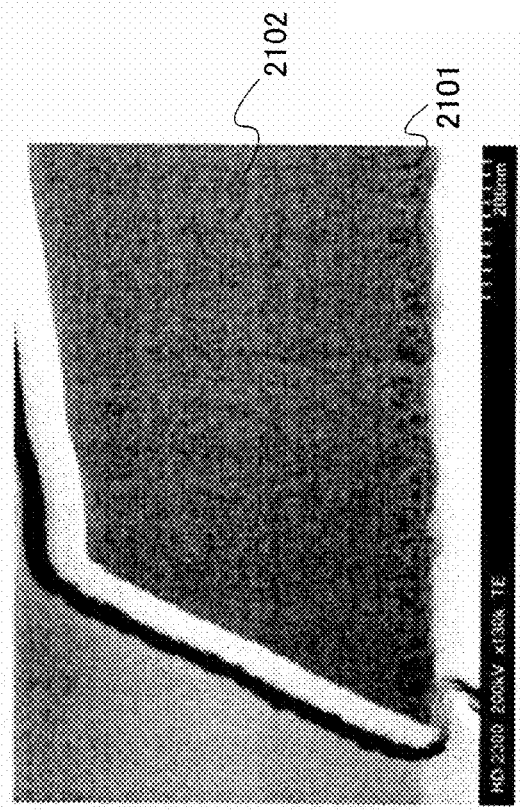
FIGS. 21A to 21C are diagrams each showing a shape of a photoelectric conversion element of the present invention with a TEM image.
Figure 21B:
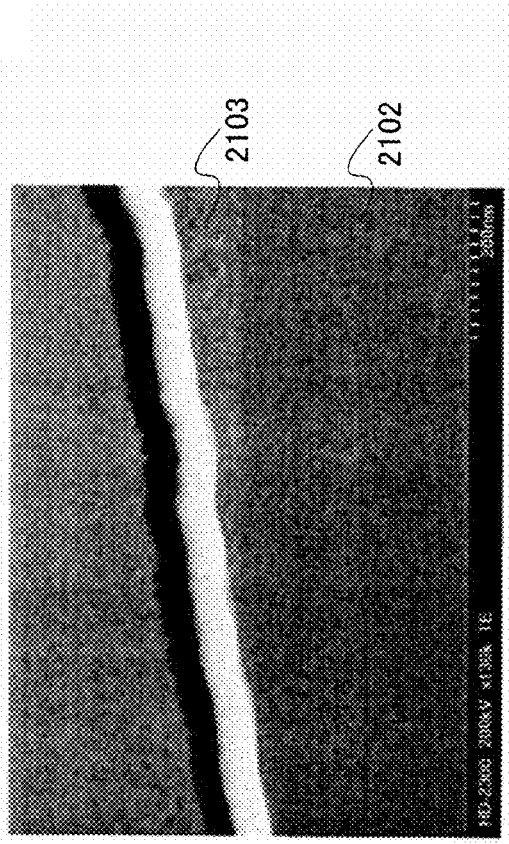
Figure 21C:
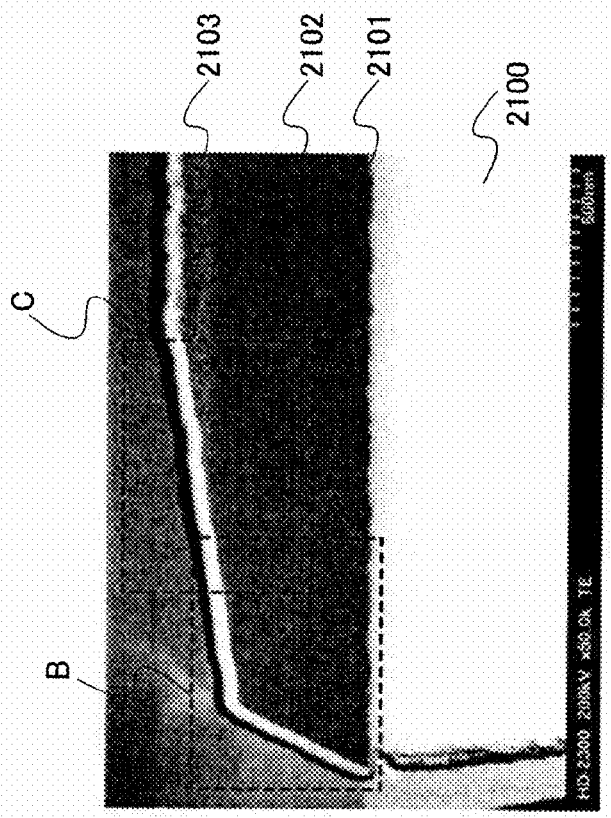

FIG. 20A shows a SEM image of a cross section of the stacked layer structure formed as described above. FIG. 20B shows a SEM image of a cross section of a stacked layer structure in a case where the third etching is not conducted. FIGS. 21A to 21C shows TEM images of cross sections of the stacked layer structure of the present invention and the TEM images correspond to FIG. 20A. Note that the SEM image is observed before removing the resist. In FIG. 20A, a p-layer 2000, an i-layer 2001, and an n-layer 2002 are shown. In FIG. 20B, a p-layer 2003, an i-layer 2004, and an n-layer 2005 are shown.

First, FIG. 20A and FIG. 20B are compared. In FIG. 20B, since the third etching is not conducted, a surface with a taper angle which includes a side surface in an end portion of the p-layer 2003 is in the same plane as a surface with a taper angle which includes a side surface in an end portion of the n-layer 2005. On the other hand, in FIG. 20A to which the present invention is applied and the third etching is conducted, a surface with a taper angle which includes a side surface in an end portion of the p-layer 2000 is in a different plane from a surface with a taper angle which includes a side surface in an end portion of the n-layer 2002.

FIGS. 21A to 21C show the TEM images of the cross sections of the stacked layer structures after removing the resist. A p-layer 2101 is formed over photosensitive acrylic 2100, an i-layer 2102 is formed over the p-layer 2101, and a n-layer 2103 is formed over the i-layer 2102. A side surface in an end portion of the semiconductor layer, in which the p-layer 2101, the i-layer 2102, and the n-layer 2103 are stacked, has two surfaces with different taper angles.

With the present invention, a stacked structure in which a side surface in an end portion of the semiconductor layer has two surfaces with different taper angles, and a side surface in an end portion of the p-layer and a side surface in an end portion of the n-layer are not in the same plane can be obtained. A highly reliable pin photoelectric conversion element with reduced leakage current can be manufactured by forming a photoelectric conversion element to have the structure shown in FIGS. 20A and 21A to 21C.

Note that this embodiment can be freely combined with Embodiment Modes 1 to 3 and another embodiment.

Embodiment 2

In a photoelectric conversion element of the present invention, unevenness can be formed in a base by etching in a manufacturing process. With unevenness formed in the base, an adhesion of a resin film or the like to be formed thereover can be improved.

A sample used in this embodiment includes a silicon oxide film formed over a substrate, photosensitive polyimide formed over the silicon oxide film, photosensitive acrylic formed over the photosensitive polyimide, and a p-type semiconductor layer, an i-type semiconductor layer, and an n-type semiconductor layer sequentially stacked over the photosensitive acrylic. Amorphous silicon is used for the all semiconductor layers.

Glass is used for the substrate. First, the silicon oxide film is formed over the glass substrate by a CVD method to have a thickness of 200 nm. Note that the film formed here is not necessarily the silicon oxide film and may be a silicon oxide-based film other than the silicon oxide film, or a silicon nitride-based film.

Then, photosensitive polyimide and photosensitive acrylic are sequentially stacked over the silicon oxide film by a spin coating method.

Next, the p-layer is formed over the photosensitive acrylic. The p-layer is formed with use of silane ($SiH_4$) containing boron (B) by a plasma CVD method.

Subsequently, the i-layer is formed over the p-layer. The i-layer is formed with use of silane ($SiH_4$) by a plasma CVD method.

Then, the n-layer is formed over the i-layer. The n-layer is formed with use of silane ($SiH_4$) containing phosphorus (P) by a plasma CVD method. Thereafter, a resist is formed.

Then, three dry etchings (first to third etchings) are conducted to a stacked layer structure, which is formed.

The first etching is conducted with use of a mixed gas of $CF_4$ and $Cl_2$. Here, the etching is conducted with a gas flow rate of 40:40 (seem), a pressure in a chamber of 2.0 Pa, and a temperature of 70° C., and an RF (13.56 MHz) electric power of 450 W is applied to a coiled electrode to generate plasma and an RF (13.56 MHz) electric power of 100 W is applied to the substrate side, so that negative bias power is substantially applied and self-bias voltage is generated.

The second etching is conducted with use of a mixed gas of $CF_4$ and $O_2$. Here, the etching and over etching are conducted with a gas flow rate of 45:55 (sccm), a pressure in a chamber of 2.5 Pa, and a temperature of 70° C., and an RF (13.56 MHz) electric power of 500 W is applied to a coiled electrode to generate plasma and an RF (13.56 MHz) electric power of 200 W is applied to the substrate side, so that negative bias power is substantially applied and self-bias voltage is generated. Note that the second etching is adjusted to include over etching.

The third etching is conducted with use of a mixed gas of $CHF_3$ and He. Here, the etching is conducted with a gas flow rate of 7.5:142.5 (seem), a pressure in a chamber of 5.5 Pa, and a temperature of 70° C., and an RF (13.56 MHz) electric power of 475 W is applied to a coiled electrode to generate plasma and an RF (13.56 MHz) electric power of 300 W is applied to the substrate side, so that negative bias power is substantially applied and self-bias voltage is generated.

Figure 22B:
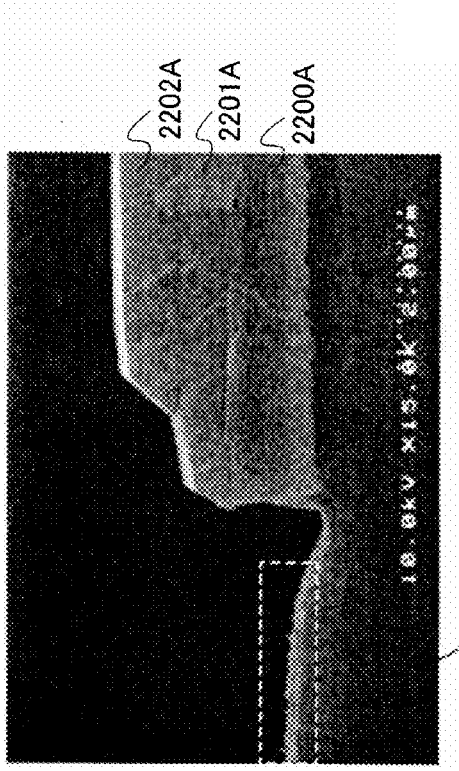
FIGS. 22A to 22D are diagrams each showing a shape of a photoelectric conversion element of the present invention with a SEM image.
Figure 22D:
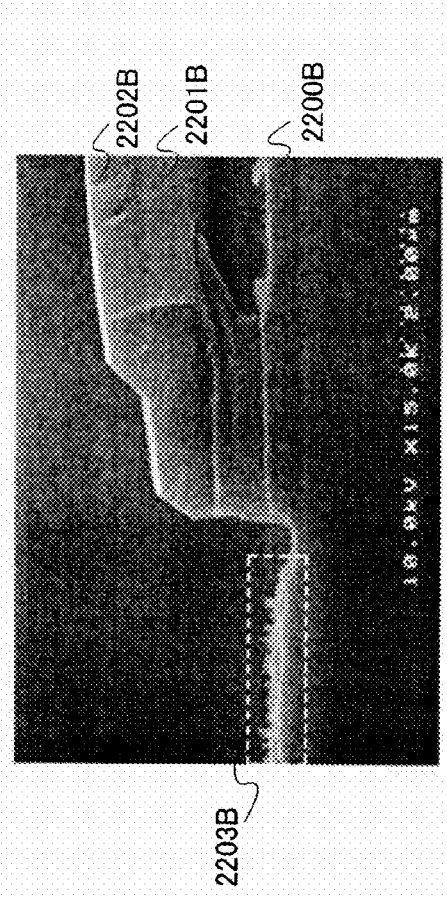
Figure 22A:
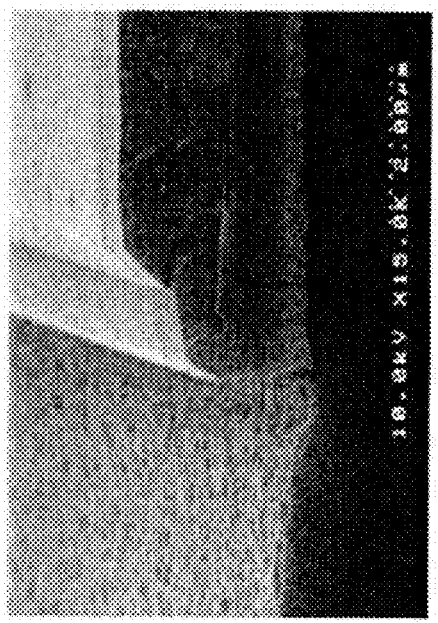
Figure 22C:
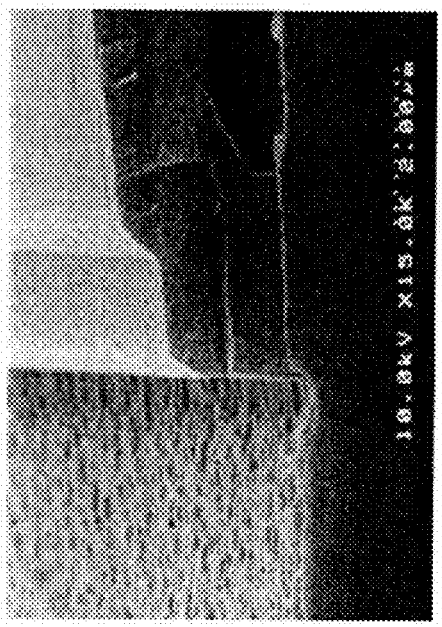

With the foregoing steps, the pin layer in which a side surface in an end portion of the semiconductor layer has two surfaces with different taper angles, and a side surface in an end portion of the p-layer and a side surface in an end portion of the n-layer are not in the same plane is obtained. The obtained pin layer is observed with a SEM. FIGS. 22A to 22D are SEM images of a cross section of a stacked layer structure of the present invention. FIGS. 22A and 22B are SEM images taken in the vicinity of an end of the substrate. FIGS. 22C and 22D are SEM images taken at the center portion of the substrate. In FIG. 22B, a base layer 2200A, a semiconductor layer 2201A, and a resist 2202A are shown. In FIG. 22D, a base layer 2200B, a semiconductor layer 2201B, and a resist 2202B are shown. The base layer 2200A and the base layer 2200B include a region 2203A and a region 2203B with unevenness, respectively. As clearly shown in FIGS. 22A to 22D, unevenness is formed in the base layer both in the vicinity of the end of the substrate and in the center portion of the substrate.

With the present invention, unevenness is formed in the base layer. Therefore, adhesion of a resin film or the like to be formed in a subsequent step is improved. With improved adhesion, a highly reliable pin photoelectric conversion element can be manufactured with a high yield.

Note that this embodiment can be freely combined with Embodiment Modes 1 to 3 and another embodiment.

Embodiment 3

This embodiment describes examples in which the photoelectric conversion device of the present invention is applied to various electronic appliances with reference to FIGS. 14 to 18B. As an electronic appliance including a photoelectric conversion device of the present invention, a computer, a display, a mobile phone, a television, and the like can be given.

Figure 14:
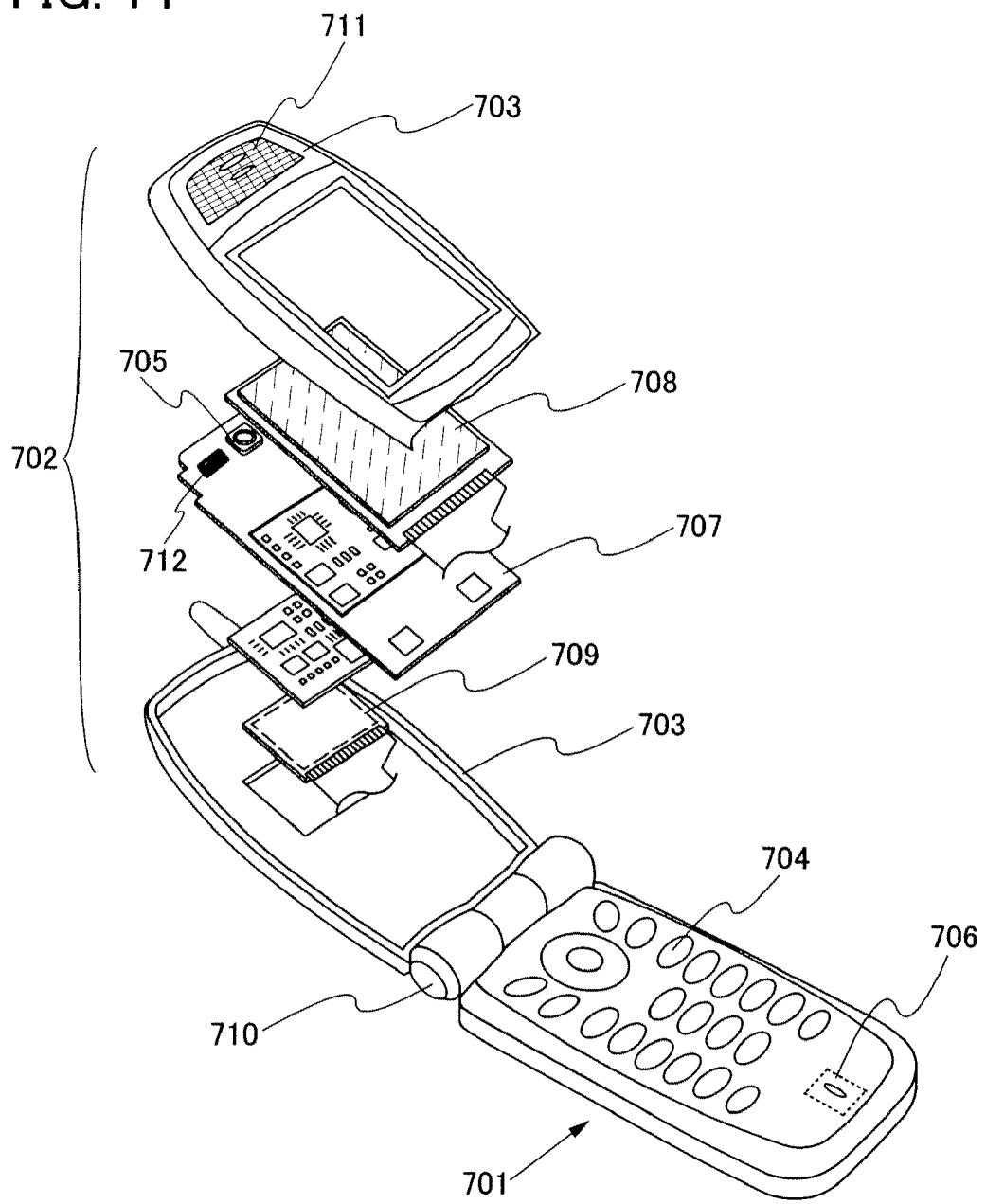
FIG. 14 shows an electronic appliance including a photoelectric conversion device of the present invention.

FIG. 14 shows a mobile phone which includes a main body (A) 701, a main body (B) 702, a chassis 703, an operation key 704, an audio output portion 705, an audio input portion 706, a circuit substrate 707, a display panel (A) 708, a display panel (B) 709, a hinge 710, and a light-transmitting material portion 711. A semiconductor device 712 including a photoelectric conversion device is provided inside the chassis 703.

The semiconductor device 712 detects light which has passed through the light-transmitting material portion 711, controls luminance of the display panel (A) 708 and the display panel (B) 709 depending on the illuminance of the detected external light, and controls illumination of the operation key 704 depending on the illuminance obtained by the semiconductor device 712. By adjusting luminance of the display panel depending on the illuminance of the external light, power consumption of the mobile phone can be reduced and characteristics of the mobile phone can be improved.

Figure 15A:
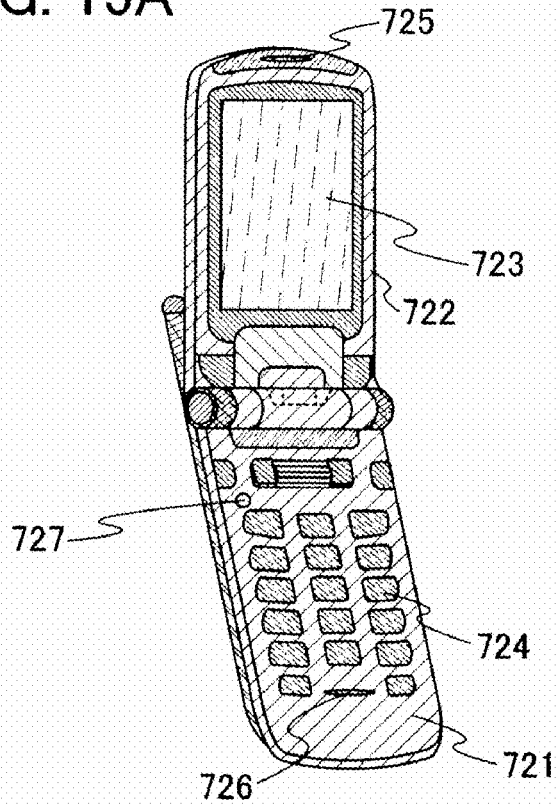
FIGS. 15A and 15B show electronic appliances including a photoelectric conversion device of the present invention.
Figure 15B:
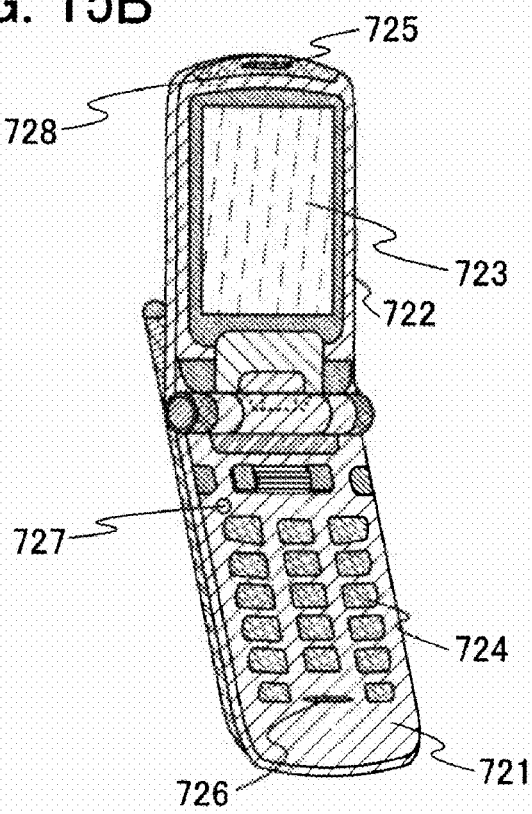

FIGS. 15A and 15B show another example of a mobile phone. The mobile phones shown in FIGS. 15A and 15B each includes a main body 721 which has a chassis 722, a display panel 723, an operation key 724, an audio output portion 725, an audio input portion 726, and a semiconductor device 727 including a photoelectric conversion device. The mobile phone shown in FIG. 15B further includes a semiconductor device 728 including a photoelectric conversion device.

The mobile phone shown in FIG. 15A can detect external light by the semiconductor device 727 including a photoelectric conversion device provided in the main body 721 and can control luminance of the display panel 723 and the operation key 724.

The mobile phone shown in FIG. 15B includes the semiconductor device 728 including a photoelectric conversion device inside the main body 721 in addition to the structure in FIG. 9A. With the semiconductor device 728 including a photoelectric conversion device, luminance of a backlight provided in the display panel 723 can be detected.

In FIGS. 14, 15A, and 15B, the photoelectric conversion device provided with a circuit which amplifies photoelectric current to be extracted as voltage output is used. Therefore, the number of components mounted on the circuit substrate can be reduced, and the mobile phone itself can be downsized.

Figure 16A:
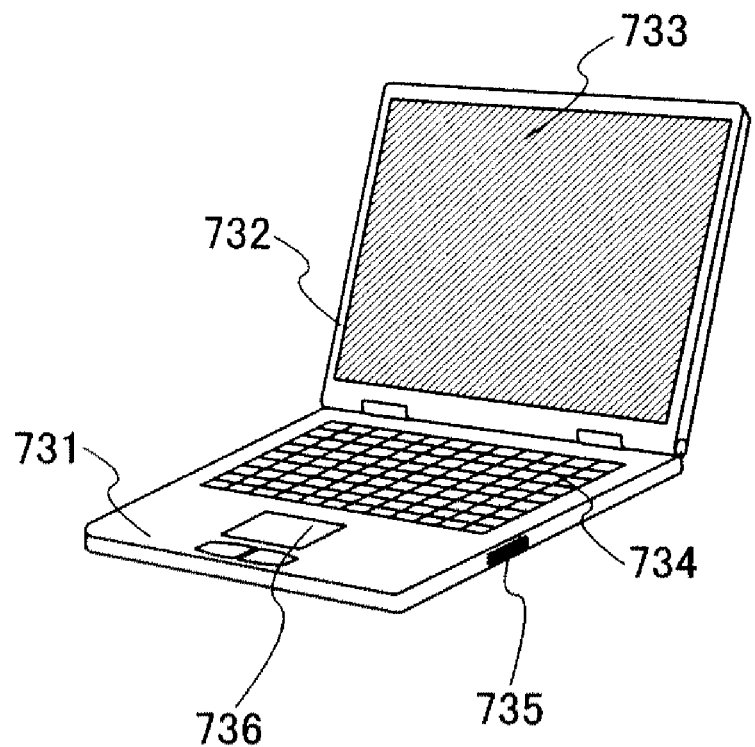
FIGS. 16A and 16B show electronic appliances including a photoelectric conversion device of the present invention.

FIG. 16A shows a computer which includes a main body 731, a chassis 732, a display portion 733, a keyboard 734, an external connection port 735, a pointing device 736, and the like.

Figure 16B:
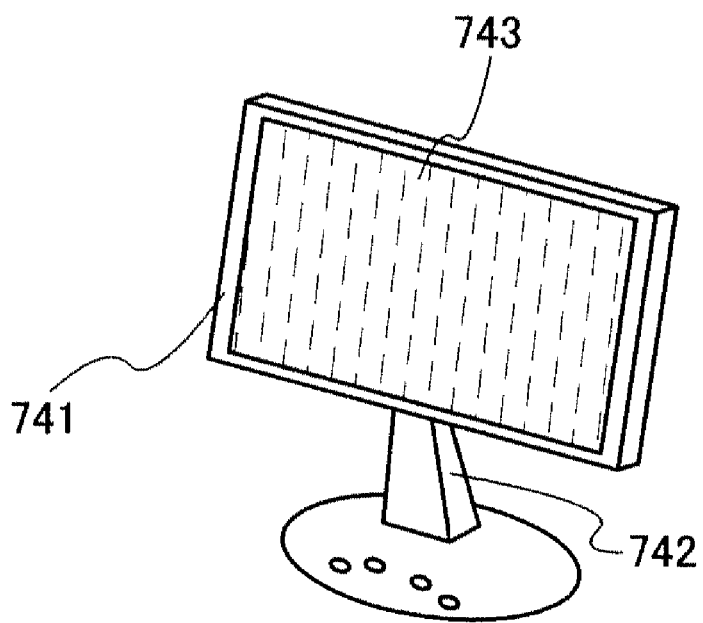

FIG. 16B shows a display device corresponds to a television receiver and the like. The display device includes a chassis 741, a support 742, a display portion 743, and the like.

FIG. 17 shows a detailed structure of the display portion 733 included in the computer in FIG. 16A and the display portion 743 included in the display device shown in FIG. 16B, in a case where a liquid crystal panel is used as the display portion.

A liquid crystal panel 762 shown in FIG. 17 is incorporated in a chassis 761. The liquid crystal panel 762 includes a substrate 751a, a substrate 751b, a liquid crystal layer 752 interposed between the substrate 751a and the substrate 751b, a polarization plate 755a, a polarization plate 755b, a backlight 753, and the like. The chassis 761 includes a semiconductor device 754 including a photoelectric conversion device.

The semiconductor device 754 including a photoelectric conversion device manufactured with use of the present invention detects the amount of light of each color of RGB from the backlight 753 including LEDs of RGB, and the information is sent back to adjust luminance of the liquid crystal panel 762. In specific, since the temperature dependency of LEDs of RGB is different from one another, the amount of light from the backlight including LEDs of RGB is detected so that variation in LED can be compensated. Further, by compensation of deterioration in LED, white balance is adjusted.

Figure 18A:
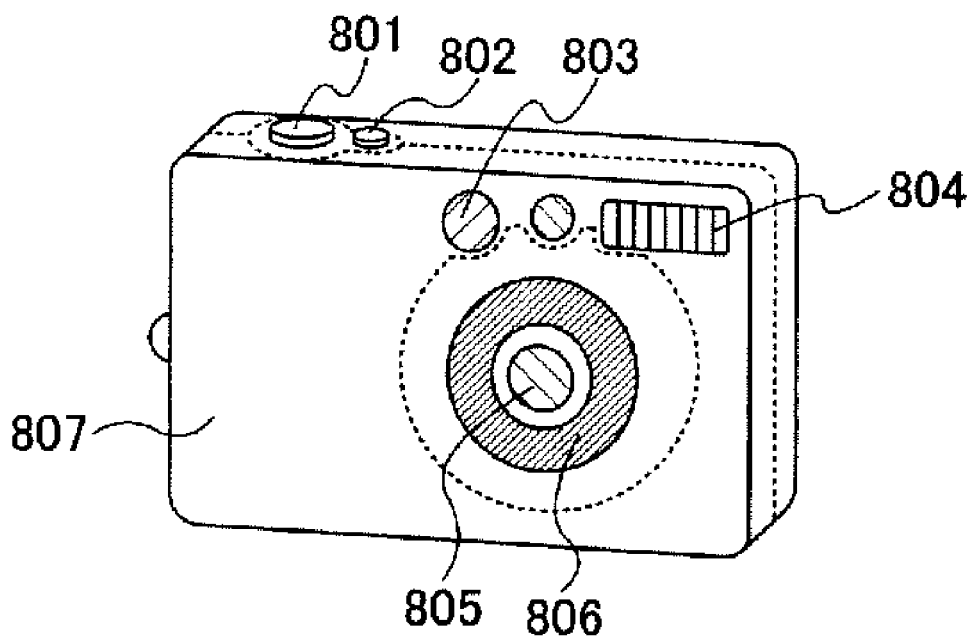
FIGS. 18A and 18B show electronic appliances including a photoelectric conversion device of the present invention.
Figure 18B:
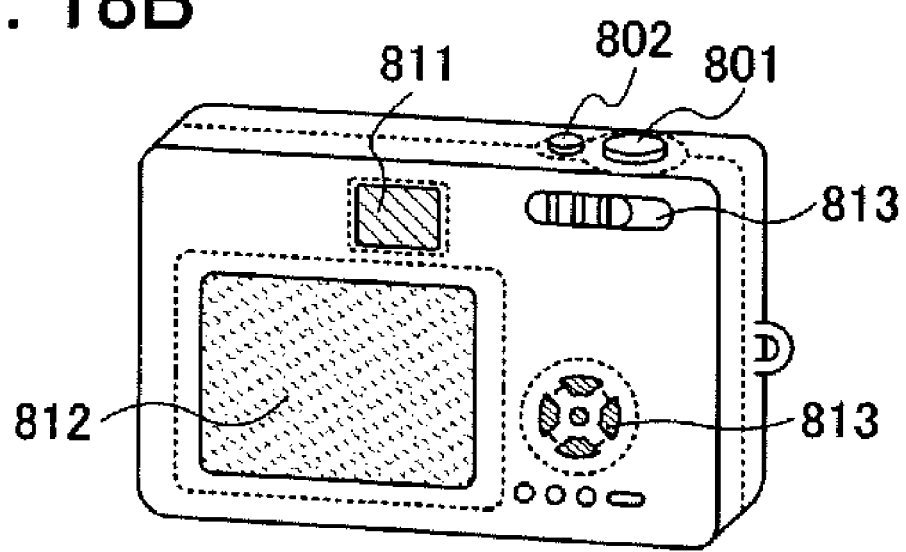

FIGS. 18A and 18B show examples where a photoelectric conversion device or a semiconductor device including a photoelectric conversion device of the present invention is incorporated into a camera (such as a digital camera). FIG. 18A is a perspective view seen from a front side of the digital camera. FIG. 18B is a perspective view seen from a backside of the digital camera. The digital camera shown in FIGS. 18A and 18B includes a shutter release button 801, a main switch 802, a viewfinder 803, a flash portion 804, a lens 805, a barrel 806, a chassis 807, an eyepiece finder 811, a monitor 812, and operation buttons 813. When the release button 801 is pushed down to a half position, a focus adjustment mechanism and an exposure adjustment mechanism are operated. When the release button 801 is pushed down to the lowest position, a shutter is opened. A power supply of the digital camera is switched on or off when the main switch 802 is pushed down or rotated.

The viewfinder 803 is located above the lens 805 on the front side of the digital camera so that an area to be photographed and a focus point can be seen through the eyepiece finder 811 shown in FIG. 18B. The flash portion 804 is located in an upper portion on the front side of the digital camera. When luminance of the subject is low, the flash portion 804 emits fill light at the same time as the release button is pushed down and the shutter is opened. The lens 805 is located at the front side of the digital camera. The lens includes a focusing lens, a zoom lens, or the like. The lens forms a photographic optical system together with the shutter and an aperture, which are not shown. In addition, an imaging element such as a CCD (Charge Coupled Device) or the like is provided behind the lens.

The barrel 806 moves the lens portion to adjust the focus of the focusing lens, a zoom lens, or the like. In taking a photograph, the barrel is slid out to move the lens 805 forward. Further, the lens 805 is collapsed so that the camera becomes small when being carried. Note that although a structure in which the subject can be photographed by zoom by sliding out the barrel 806 is employed in this embodiment, the structure is not limited thereto. A photoelectric conversion device of the present invention may be included in a digital camera capable of zooming photographing with a structure of a photographic optical system in the chassis 807, without sliding out the barrel.

The eyepiece finder 811 is a window located in an upper portion on the backside of the digital camera so that an area to be photographed and a focus point can be seen therethrough. The operation buttons 813 are provided on the backside of the digital camera and includes buttons with various functions such as a set up button, a menu button, a display button, a functional button, and a selecting button.

When the present invention is applied to a photoelectric conversion device included in the devices shown in FIGS. 14 to 18B, a highly reliable electronic appliance can be manufactured. Further, the present invention is not limited thereto and can be applied to any object which needs to detect light.

Note that this embodiment can be freely combined with Embodiment Modes 1 to 3 and another embodiment.

This application is based on Japanese Patent Application serial No. 2006-125830 filed in Japan Patent Office on Apr. 28, 2006, the entire contents of which are hereby incorporated by reference.

EXPLANATION OF REFERENCE

100: substrate, 101: first conductive layer, 102: protective layer, 104: resist, 105: region, 106: silicon oxide layer, 107: insulating layer, 108: second conductive layer, 109: insulating layer, 111: third conductive layer, 112: first conductive layer, 115: base layer, 116: region, 117: second conductive layer, 200: substrate, 203: interlayer insulating layer, 204: color filter layer, 208: light blocking layer, 209: insulating layer, 210: conductive layer, 211: resin, 212: contact electrode, 701: main body (A), 702: main body (B), 703: chassis, 704: operation key, 705: audio output portion, 706: audio input portion, 707: circuit substrate, 708: display panel (A), 709: display panel (B), 710: hinge, 711: light-transmitting material portion, 712: semiconductor device, 721: main body, 722: chassis, 723: display panel, 724: operation key, 725: audio output portion, 726: audio input portion, 727: semiconductor device, 728: semiconductor device, 731: main body, 732: chassis, 733: display portion, 734: keyboard, 735: external connection port, 736: pointing device, 741: chassis, 742: support, 743: display portion, 752: liquid crystal layer, 753: backlight, 754: semiconductor device, 761: chassis, 762: liquid crystal panel, 801: release button, 802: main switch, 803: viewfinder, 804: flash portion, 805: lens, 806: barrel, 807: chassis, 811: eyepiece finder, 812: monitor, 813: operation button, 103A: semiconductor layer, 103B: semiconductor layer, 103C: semiconductor layer, 103D: semiconductor layer, 110A: opening, 110B: opening, 114A: region, 114C: region, 114D: region, 181A: semiconductor device, 182A: current amplifier circuit, 183A: photoelectric conversion element, 184A: n-type TFT, 185A: n-type TFT, 186A: output terminal, 187A: external power source terminal, 181B: semiconductor device, 182B: current amplifier circuit, 183B: photoelectric conversion element, 184B: p-type TFT, 185B: p-type TFT, 186B: output terminal, 187B: external power source terminal, 2000: p-layer, 2001: i-layer, 2002: n-layer, 2003: p-layer, 2004: i-layer, 2005: n-layer, 2011: insulating layer, 2012: semiconductor layer, 2013: impurity region, 2014: channel formation region, 2015: insulating layer, 2016: conductive layer, 2017: insulating layer, 2018: insulating layer, 2019: conductive layer, 201A: TFT, 201B: TFT, 202A: photoelectric conversion element portion, 202B: photoelectric conversion element portion, 204A: color filter layer, 204B: color filter layer, 205A: first conductive layer, 205B: first conductive layer, 205C: light blocking layer, 205D: light blocking layer, 206A: overcoat layer, 206B: overcoat layer, 207A: light blocking layer, 207B: light blocking layer, 207C: light blocking layer, 207D: light blocking layer, 208A: light blocking layer, 208B: light blocking layer, 208C: light blocking layer, 208D: light blocking layer, 208E: light blocking layer, 2100: photosensitive acrylic, 2101: p-layer, 2102: i-layer, 2103: n-layer, 751*a*: substrate, 751*b*: substrate, 755*a*: polarization plate, 755*b*: polarization plate, 2200A: base layer, 2200B: base layer, 2201A: semiconductor layer, 2201B: semiconductor layer, 2202A: resist, 2202B: resist, 2203A: region, 2203B: region.

What is claimed is:

1. A photoelectric conversion element, comprising:
a photoelectric conversion layer including stacked layers of a first semiconductor layer, a second semiconductor layer and a third semiconductor layer;
the first semiconductor layer containing an impurity element of one conductivity type, on a conductive layer;
the second semiconductor layer formed on the first semiconductor layer; and
the third semiconductor layer containing an impurity element of an opposite conductivity type to that in the first semiconductor layer, on the second semiconductor layer,
wherein a side surface of the photoelectric conversion layer includes a surface with a first taper angle and a surface with a second taper angle,
wherein the surface with the first taper angle includes a side surface of the first semiconductor layer and a side surface of the second semiconductor layer,
wherein the surface with the second taper angle includes a side surface of the third semiconductor layer, and
wherein the surface with the first taper angle and the surface with the second taper angle have different taper angles.

2. The photoelectric conversion element according to claim 1,
wherein the first to third semiconductor layers contain silicon as main components.

3. The photoelectric conversion element according to claim 1,
wherein the first semiconductor layer is a p-type semiconductor layer,
wherein the second semiconductor layer is an intrinsic semiconductor layer,
wherein the third semiconductor layer is an n-type semiconductor layer, and
wherein the conductive layer is formed over a light-transmitting substrate.

4. The photoelectric conversion element according to claim 1,
wherein the conductive layer has a tapered shape.

5. The photoelectric conversion element according to claim 1,
wherein the first semiconductor layer is formed over a protective layer, and
wherein the protective layer covers an end portion of the conductive layer.

6. The photoelectric conversion element according to claim 1,
wherein the first semiconductor layer is formed over a protective layer,
wherein the protective layer covers an end portion of the conductive layer,
wherein the protective layer has a color filter layer, and
wherein an overcoat layer is provided between the color filter layer and the photoelectric conversion layer.

7. The photoelectric conversion element according to claim 1,
wherein the photoelectric conversion element is formed over a base layer, and
wherein the base layer comprises a material selected from a group consisting of a polyimide, an acrylic resin, an epoxy resin and a combination thereof.

8. The photoelectric conversion element according to claim 1,
wherein the photoelectric conversion element is formed over a base layer,
wherein the base layer comprises a material selected from a group consisting of a polyimide, an acrylic resin, an epoxy resin and a combination thereof, and
wherein a region in the base layer which is not overlapped with the photoelectric conversion element has unevenness.

9. The photoelectric conversion element according to claim 1,
wherein the photoelectric conversion element is formed over a base layer,
wherein the base layer comprises a material selected from a group consisting of a polyimide, an acrylic resin, an epoxy resin and a combination thereof,
wherein a region in the base layer which is not overlapped with the photoelectric conversion element has unevenness, and
wherein a layer formed of a same material as the base layer is provided over the region with unevenness in the base layer.

10. The photoelectric conversion element according to claim 1,
wherein the conductive layer comprises a light-transmitting conductive material.

11. The photoelectric conversion element according to claim 1,
wherein the conductive layer comprises titanium.

12. The photoelectric conversion element according to claim 1,
wherein a light blocking layer is provided in a region overlapping with an end portion of the photoelectric conversion element.

13. A photoelectric conversion element, comprising:
a photoelectric conversion layer including stacked layers of a first semiconductor layer, a second semiconductor layer and a third semiconductor layer;
the first semiconductor layer containing an impurity element of one conductivity type, on a conductive layer;
the second semiconductor layer formed on the first semiconductor layer; and
the third semiconductor layer containing an impurity element of an opposite conductivity type to that in the first semiconductor layer, on the second semiconductor layer,
wherein a side surface of the photoelectric conversion layer includes a surface with a first taper angle and a surface with a second taper angle,
wherein the surface with the first taper angle includes a side surface of the first semiconductor layer and a side surface of the second semiconductor layer,
wherein the surface with the second taper angle includes a side surface of the third semiconductor layer, and
wherein the surface with the first taper angle has a larger taper angle than the surface with the second taper angle.

14. The photoelectric conversion element according to claim 13,
wherein the first to third semiconductor layers contain silicon as main components.

15. The photoelectric conversion element according to claim 13,
wherein the first semiconductor layer is a p-type semiconductor layer,
wherein the second semiconductor layer is an intrinsic semiconductor layer,
wherein the third semiconductor layer is an n-type semiconductor layer, and
wherein the conductive layer is formed over a light-transmitting substrate.

16. The photoelectric conversion element according to claim 13,
wherein the conductive layer has a tapered shape.

17. The photoelectric conversion element according to claim 13,
wherein the first semiconductor layer is formed over a protective layer, and
wherein the protective layer covers an end portion of the conductive layer.

18. The photoelectric conversion element according to claim 13,
wherein the first semiconductor layer is formed over a protective layer,
wherein the protective layer covers an end portion of the conductive layer,
wherein the protective layer has a color filter layer, and
wherein an overcoat layer is provided between the color filter layer and the photoelectric conversion layer.

19. The photoelectric conversion element according to claim 13,
wherein the photoelectric conversion element is formed over a base layer, and
wherein the base layer comprises a material selected from a group consisting of a polyimide, an acrylic resin, an epoxy resin and a combination thereof.

20. The photoelectric conversion element according to claim 13,
wherein the photoelectric conversion element is formed over a base layer,
wherein the base layer comprises a material selected from a group consisting of a polyimide, an acrylic resin, an epoxy resin and a combination thereof, and
wherein a region in the base layer which is not overlapped with the photoelectric conversion element has unevenness.

21. The photoelectric conversion element according to claim 13,
wherein the photoelectric conversion element is formed over a base layer,
wherein the base layer comprises a material selected from a group consisting of a polyimide, an acrylic resin, an epoxy resin and a combination thereof,
wherein a region in the base layer which is not overlapped with the photoelectric conversion element has unevenness, and wherein a layer formed of a same material as the base layer is provided over the region with unevenness in the base layer.

22. The photoelectric conversion element according to claim 13,
wherein the conductive layer comprises a light-transmitting conductive material.

23. The photoelectric conversion element according to claim 13,
wherein the conductive layer comprises titanium.

24. The photoelectric conversion element according to claim 13,
wherein a light blocking layer is provided in a region overlapping with an end portion of the photoelectric conversion element.

25. A photoelectric conversion element, comprising:
a photoelectric conversion layer including stacked layers of a first semiconductor layer, a second semiconductor layer and a third semiconductor layer;
the first semiconductor layer containing an impurity element of one conductivity type, on a conductive layer;
the second semiconductor layer formed on the first semiconductor layer; and
the third semiconductor layer containing an impurity element of an opposite conductivity type to that in the first semiconductor layer, on the second semiconductor layer,
wherein a side surface of the photoelectric conversion layer includes a surface with a first taper angle and a surface with a second taper angle,
wherein, in a cross sectional view of the photoelectric conversion layer, the surface with the first taper angle includes a side surface of the first semiconductor layer and an entire side surface of the second semiconductor layer,
wherein the surface with the second taper angle includes a side surface of the third semiconductor layer, and
wherein the surface with the first taper angle and the surface with the second taper angle have different taper angles.

26. The photoelectric conversion element according to claim 25,
wherein the first to third semiconductor layers contain silicon as main components.

27. The photoelectric conversion element according to claim 25,
wherein the first semiconductor layer is a p-type semiconductor layer,
wherein the second semiconductor layer is an intrinsic semiconductor layer,
wherein the third semiconductor layer is an n-type semiconductor layer, and
wherein the conductive layer is formed over a light-transmitting substrate.

28. The photoelectric conversion element according to claim 25,
wherein the conductive layer has a tapered shape.

29. The photoelectric conversion element according to claim 25,
wherein the first semiconductor layer is formed over a protective layer, and
wherein the protective layer covers an end portion of the conductive layer.

30. The photoelectric conversion element according to claim 25,
wherein the first semiconductor layer is formed over a protective layer,
wherein the protective layer covers an end portion of the conductive layer,
wherein the protective layer has a color filter layer, and
wherein an overcoat layer is provided between the color filter layer and the photoelectric conversion layer.

31. The photoelectric conversion element according to claim 25,
wherein the photoelectric conversion element is formed over a base layer, and
wherein the base layer comprises a material selected from a group consisting of a polyimide, an acrylic resin, an epoxy resin and a combination thereof.

32. The photoelectric conversion element according to claim 25,
wherein the photoelectric conversion element is formed over a base layer,
wherein the base layer comprises a material selected from a group consisting of a polyimide, an acrylic resin, an epoxy resin and a combination thereof, and
wherein a region in the base layer which is not overlapped with the photoelectric conversion element has unevenness.

33. The photoelectric conversion element according to claim 25,
wherein the photoelectric conversion element is formed over a base layer,
wherein the base layer comprises a material selected from a group consisting of a polyimide, an acrylic resin, an epoxy resin and a combination thereof,
wherein a region in the base layer which is not overlapped with the photoelectric conversion element has unevenness, and
wherein a layer formed of a same material as the base layer is provided over the region with unevenness in the base layer.

34. The photoelectric conversion element according to claim 25,
wherein the conductive layer comprises a light-transmitting conductive material.

35. The photoelectric conversion element according to claim 25,
wherein the conductive layer comprises titanium.

36. The photoelectric conversion element according to claim 25,
wherein a light blocking layer is provided in a region overlapping with an end portion of the photoelectric conversion element.

37. A photoelectric conversion element, comprising:
a photoelectric conversion layer including stacked layers of a first semiconductor layer, a second semiconductor layer and a third semiconductor layer;
the first semiconductor layer containing an impurity element of one conductivity type, on a conductive layer;
the second semiconductor layer formed on the first semiconductor layer; and
the third semiconductor layer containing an impurity element of an opposite conductivity type to that in the first semiconductor layer, on the second semiconductor layer,
wherein a side surface of the photoelectric conversion layer includes a surface with a first taper angle and a surface with a second taper angle,
wherein, in a cross sectional view of the photoelectric conversion layer, the surface with the first taper angle includes a side surface of the first semiconductor layer and an entire side surface of the second semiconductor layer, wherein the surface with the second taper angle includes a side surface of the third semiconductor layer, and wherein the surface with the first taper angle has a larger taper angle than the surface with the second taper angle.

38. The photoelectric conversion element according to claim 37, wherein the first to third semiconductor layers contain silicon as main components.

39. The photoelectric conversion element according to claim 37, wherein the first semiconductor layer is a p-type semiconductor layer, wherein the second semiconductor layer is an intrinsic semiconductor layer, wherein the third semiconductor layer is an n-type semiconductor layer, and wherein the conductive layer is formed over a light-transmitting substrate.

40. The photoelectric conversion element according to claim 37, wherein the conductive layer has a tapered shape.

41. The photoelectric conversion element according to claim 37, wherein the first semiconductor layer is formed over a protective layer, and wherein the protective layer covers an end portion of the conductive layer.

42. The photoelectric conversion element according to claim 37, wherein the first semiconductor layer is formed over a protective layer, wherein the protective layer covers an end portion of the conductive layer, wherein the protective layer has a color filter layer, and wherein an overcoat layer is provided between the color filter layer and the photoelectric conversion layer.

43. The photoelectric conversion element according to claim 37, wherein the photoelectric conversion element is formed over a base layer, and wherein the base layer comprises a material selected from a group consisting of a polyimide, an acrylic resin, an epoxy resin and a combination thereof.

44. The photoelectric conversion element according to claim 37, wherein the photoelectric conversion element is formed over a base layer, wherein the base layer comprises a material selected from a group consisting of a polyimide, an acrylic resin, an epoxy resin and a combination thereof, and wherein a region in the base layer which is not overlapped with the photoelectric conversion element has unevenness.

45. The photoelectric conversion element according to claim 37, wherein the photoelectric conversion element is formed over a base layer, wherein the base layer comprises a material selected from a group consisting of a polyimide, an acrylic resin, an epoxy resin and a combination thereof, wherein a region in the base layer which is not overlapped with the photoelectric conversion element has unevenness, and wherein a layer formed of a same material as the base layer is provided over the region with unevenness in the base layer.

46. The photoelectric conversion element according to claim 37, wherein the conductive layer comprises a light-transmitting conductive material.

47. The photoelectric conversion element according to claim 37, wherein the conductive layer comprises titanium.

48. The photoelectric conversion element according to claim 37, wherein a light blocking layer is provided in a region overlapping with an end portion of the photoelectric conversion element.

* * * * *

UNITED STATES PATENT AND TRADEMARK OFFICE
CERTIFICATE OF CORRECTION

| | | |
|---|---|---|
| PATENT NO. | : 7,791,154 B2 | Page 1 of 1 |
| APPLICATION NO. | : 12/575910 | |
| DATED | : September 7, 2010 | |
| INVENTOR(S) | : Shinya Sasagawa et al. | |

It is certified that error appears in the above-identified patent and that said Letters Patent is hereby corrected as shown below:

Column 23, line 5, replace "seem" with --sccm--;

Column 24, line 41, replace "seem" with --sccm--;

Column 24, line 59, replace "seem" with --sccm--.

Signed and Sealed this
First Day of March, 2011

David J. Kappos
*Director of the United States Patent and Trademark Office*